(12) United States Patent
Park et al.

(10) Patent No.: US 11,749,662 B2
(45) Date of Patent: Sep. 5, 2023

(54) SEMICONDUCTOR PACKAGE

(71) Applicant: SAMSUNG ELECTRONICS CO., LTD., Suwon-si (KR)

(72) Inventors: Sangcheon Park, Hwaseong-si (KR); Youngmin Lee, Hwaseong-si (KR)

(73) Assignee: SAMSUNG ELECTRONICS CO., LTD., Suwon-si (KR)

( * ) Notice: Subject to any disclaimer, the term of this patent is extended or adjusted under 35 U.S.C. 154(b) by 0 days.

(21) Appl. No.: 17/505,040

(22) Filed: Oct. 19, 2021

(65) Prior Publication Data

US 2022/0293580 A1   Sep. 15, 2022

(30) Foreign Application Priority Data

Mar. 9, 2021  (KR) ........................ 10-2021-0030941

(51) Int. Cl.
| | | |
|---|---|---|
| *H01L 25/18* | (2023.01) | |
| *H01L 23/00* | (2006.01) | |
| *H01L 23/48* | (2006.01) | |
| *H01L 23/522* | (2006.01) | |
| *H01L 23/544* | (2006.01) | |

(52) U.S. Cl.
CPC ............ *H01L 25/18* (2013.01); *H01L 23/481* (2013.01); *H01L 23/5226* (2013.01); *H01L 23/544* (2013.01); *H01L 24/08* (2013.01); *H01L 2223/54426* (2013.01); *H01L 2224/0224* (2013.01); *H01L 2224/08145* (2013.01)

(58) Field of Classification Search
None
See application file for complete search history.

(56) References Cited

U.S. PATENT DOCUMENTS

| | | |
|---|---|---|
| 8,802,538 B1 | 8/2014 | Liu et al. |
| 8,809,123 B2 | 8/2014 | Liu et al. |
| 8,957,358 B2 | 2/2015 | Wan et al. |
| 9,142,517 B2 | 9/2015 | Liu et al. |
| 9,461,007 B2 | 10/2016 | Chun et al. |
| 9,613,881 B2 | 4/2017 | Ahn et al. |
| 9,799,587 B2 | 10/2017 | Fujii et al. |
| 10,312,201 B1 | 6/2019 | Hu et al. |
| 10,504,852 B1 | 12/2019 | Chen et al. |
| 10,692,826 B2 | 6/2020 | Wei et al. |
| 2019/0157334 A1 | 5/2019 | Wei et al. |
| 2020/0020684 A1 | 1/2020 | Chen et al. |

(Continued)

*Primary Examiner* — Telly D Green
(74) *Attorney, Agent, or Firm* — Sughrue Mion, PLLC

(57) ABSTRACT

A semiconductor package includes: a first semiconductor chip including a plurality of front surface pads disposed on a first active surface of a first semiconductor substrate, at least one penetrating electrode penetrating at least a portion of the first semiconductor substrate and connected to the front surface pads, a first rear surface cover layer disposed on a first inactive surface of the first semiconductor substrate, a first rear surface dummy conductive layer penetrating a portion of the first rear surface cover layer; a second semiconductor chip including a second front surface cover layer disposed on a second active surface of a second semiconductor substrate, and a second front surface dummy conductive layer penetrating a portion of the second front surface cover layer; and at least one first bonded pad penetrating the first rear surface cover layer and the second front surface cover layer.

20 Claims, 18 Drawing Sheets

(56) References Cited

U.S. PATENT DOCUMENTS

2020/0105721 A1     4/2020  Park
2020/0365514 A1*   11/2020  Yang ................. H01L 21/76802
2022/0013502 A1*    1/2022  Lee ......................... H01L 24/06

* cited by examiner

SEMICONDUCTOR PACKAGE

CROSS-REFERENCE TO RELATED APPLICATION

This application is based on and claims priority under 35 U.S.C. § 119 to Korean Patent Application No. 10-2021-0030941, filed on Mar. 9, 2021 in the Korean Intellectual Property Office, the disclosure of which is incorporated by reference herein in its entirety.

BACKGROUND

The embodiments of the inventive concept relate to a semiconductor package, and more particularly, to a semiconductor package including stacked semiconductor chips.

As electronic products are required to be miniaturized, multifunctional, and have high performance, there is also demand for high integration and high speed of semiconductor packages. To this end, semiconductor packages including a plurality of semiconductor chips including stacked semiconductor chips have been developed.

SUMMARY

The embodiments of the inventive concept provide a semiconductor package including stacked semiconductor chips with an improved operation reliability.

The embodiments provide a semiconductor package as follows.

A semiconductor package includes: a first semiconductor chip, a second semiconductor chip, and at least one first bonded pad connecting the first and second semiconductor chips, wherein the first semiconductor chip includes: a first semiconductor substrate including a first active surface and a first inactive surface opposite to each other; a plurality of first front surface pads disposed on the first active surface of the first semiconductor substrate; at least one first penetrating electrode penetrating at least a portion of the first semiconductor substrate and connected to the first front surface pads; a first rear surface cover layer disposed on the first inactive surface of the first semiconductor substrate; and a first rear surface alignment pattern disposed in the first rear surface cover layer, wherein the second semiconductor chip includes: a second semiconductor substrate stacked on the first semiconductor chip and including a second semiconductor element on a second active surface thereof; a second front surface cover layer disposed on the second active surface of the second semiconductor substrate; and a second front surface alignment pattern disposed in the second front surface cover layer and separated apart from the rear surface alignment pattern, wherein the first bonded pad penetrates the first rear surface cover layer and the second front surface cover layer, and is connected to the first penetrating electrode, wherein the first bonded pad has a height that is greater than a sum of a thickness of the first rear surface cover layer and a thickness of the second front surface cover layer, and equal to or smaller than two times a sum of a thickness of the first rear surface alignment pattern and a thickness of the second front surface alignment pattern.

A semiconductor package includes: a first semiconductor chip, a second semiconductor chip, and at least one first bonded pad connecting the first and second semiconductor chips, wherein the first semiconductor chip includes: a first semiconductor substrate including a first semiconductor element on a first active surface thereof; a plurality of first front surface pads disposed on the first active surface of the first semiconductor substrate; at least one first penetrating electrode penetrating at least a portion of the first semiconductor substrate and connected to the first front surface pads; a first rear surface cover layer disposed on a first inactive surface of the first semiconductor substrate; and a first rear surface dummy conductive layer including a first rear surface alignment pattern and penetrating a portion of the first rear surface cover layer; wherein the second semiconductor chip includes: a second semiconductor substrate stacked on the first semiconductor chip, and including a second semiconductor element on a second active surface thereof; a second front surface cover layer disposed on the second active surface; and a second front surface dummy conductive layer including a second front surface alignment pattern separated apart from the first rear surface alignment pattern and penetrating a portion of the second front surface cover layer; and wherein the first bonded pad penetrates the first rear surface cover layer and the second front surface cover layer, and is connected to the first penetrating electrode.

A semiconductor package includes: a first semiconductor chip; at least two second semiconductor chips stacked on the first semiconductor chip; at least one first bonded pad connecting the second semiconductor chip at a lowermost end of the two second semiconductor chips to the first semiconductor chip; and at least one second bonded pad connecting the two second semiconductor chips to each other, wherein the first semiconductor chip includes: a first semiconductor substrate including a first active surface and a first inactive surface opposite to each other; a plurality of first front surface pads arranged on the first active surface; at least one first penetrating electrode penetrating at least a portion of the first semiconductor substrate, and connected to the first bonded pad; a first rear surface cover layer including a first lower rear surface cover layer disposed on the first inactive surface and a first upper rear surface cover layer disposed on the first lower rear surface cover layer; and a first rear surface dummy conductive layer disposed in the first lower rear surface cover layer and including a first rear surface alignment pattern, wherein the two second semiconductor chips includes: a second semiconductor substrate including a second active surface and a second inactive surface opposite to each other; a second front surface cover layer including a second lower front surface cover layer disposed on the second active surface, and a second upper front surface cover layer disposed on the second lower front surface cover layer; a second front surface dummy conductive layer disposed in the second lower front surface cover layer and including a second front surface alignment pattern; at least one second penetrating electrode penetrating at least a portion of the second semiconductor substrate, and connecting the first bonded pad to the second bonded pad; a second rear surface cover layer including a second lower rear surface cover layer disposed on the second inactive surface, and a second upper rear surface cover layer disposed on the second lower rear surface cover layer; and a second rear surface dummy conductive layer disposed in the second rear surface cover layer and including a second rear surface alignment pattern, wherein the first bonded pad penetrates the first rear surface cover layer and a second front surface cover layer of the second semiconductor chip at the lowermost end, wherein the second bonded pad penetrates the second front surface cover layer and a second rear surface cover layer, facing each other, of another second semiconductor chip of the two second semiconductor chips.

BRIEF DESCRIPTION OF THE DRAWINGS

Embodiments of the inventive concept will be more clearly understood from the following detailed description taken in conjunction with the accompanying drawings in which.

DETAILED DESCRIPTION OF EMBODIMENTS

The embodiments described herein are all example embodiments, and thus, the inventive concept is not limited thereto and may be realized in various other forms.

It will be understood that when an element or layer is referred to as being "over," "above," "on," "below," "under," "beneath," "connected to" or "coupled to" another element or layer, it can be directly over, above, on, below, under, beneath, connected or coupled to the other element or layer or intervening elements or layers may be present. In contrast, when an element is referred to as being "directly over," "directly above," "directly on," "directly below," "directly under," "directly beneath," "directly connected to" or "directly coupled to" another element or layer, there are no intervening elements or layers present.

It will be understood that, although the terms first, second, third, fourth etc. may be used herein to describe various elements, components, regions, layers and/or sections, these elements, components, regions, layers and/or sections should not be limited by these terms. These terms are only used to distinguish one element, component, region, layer or section from another region, layer or section. Thus, a first element, component, region, layer or section discussed below could be termed a second element, component, region, layer or section without departing from the teachings of the present inventive concept.

Spatially relative terms, such as "over," "above," "on," "upper," "below," "under," "beneath," "lower," and the like, may be used herein for ease of description to describe one element's or feature's relationship to another element(s) or feature(s) as illustrated in the figures. It will be understood that the spatially relative terms are intended to encompass different orientations of the device in use or operation in addition to the orientation depicted in the figures. For example, if the device in the figures is turned over, elements described as "below" or "beneath" other elements or features would then be oriented "above" the other elements or features. Thus, the term "below" can encompass both an orientation of above and below. The device may be otherwise oriented (rotated 90 degrees or at other orientations) and the spatially relative descriptors used herein interpreted accordingly.

Figure 1:
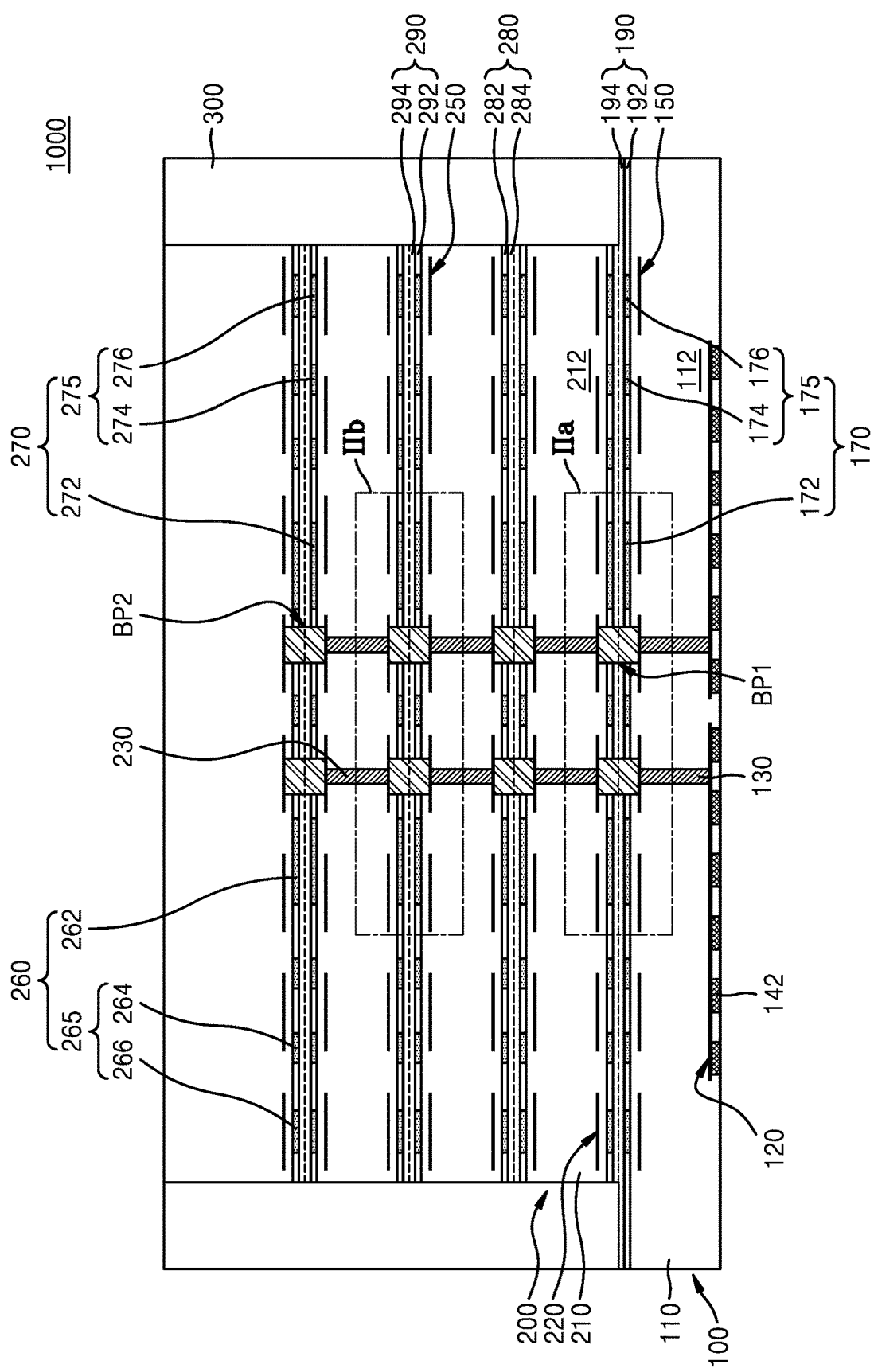
FIG. 1 is a cross-sectional view of a semiconductor package according to an embodiment.
Figure 2A:
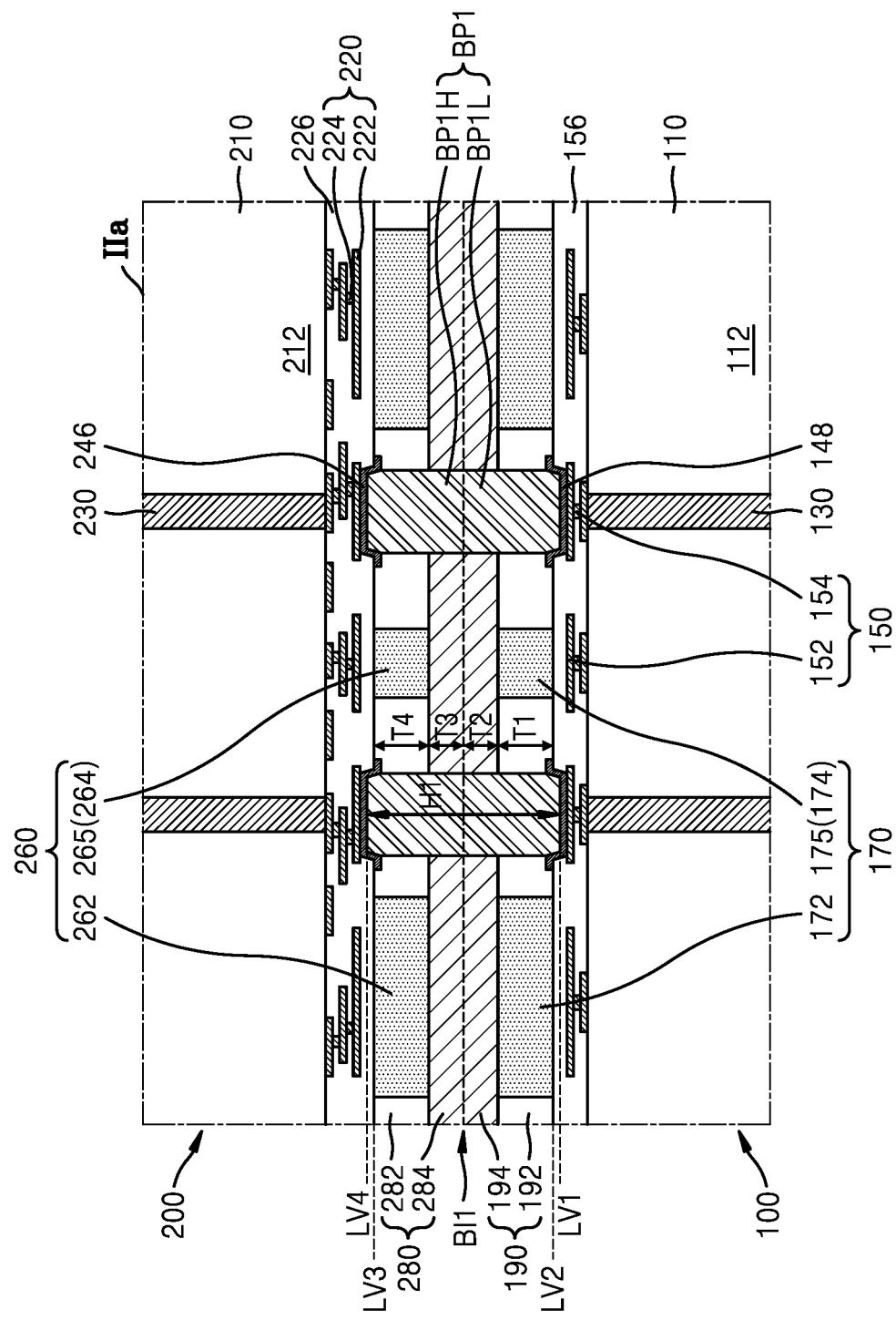
FIGS. 2A and 2B are enlarged cross-sectional views thereof.
Figure 2B:
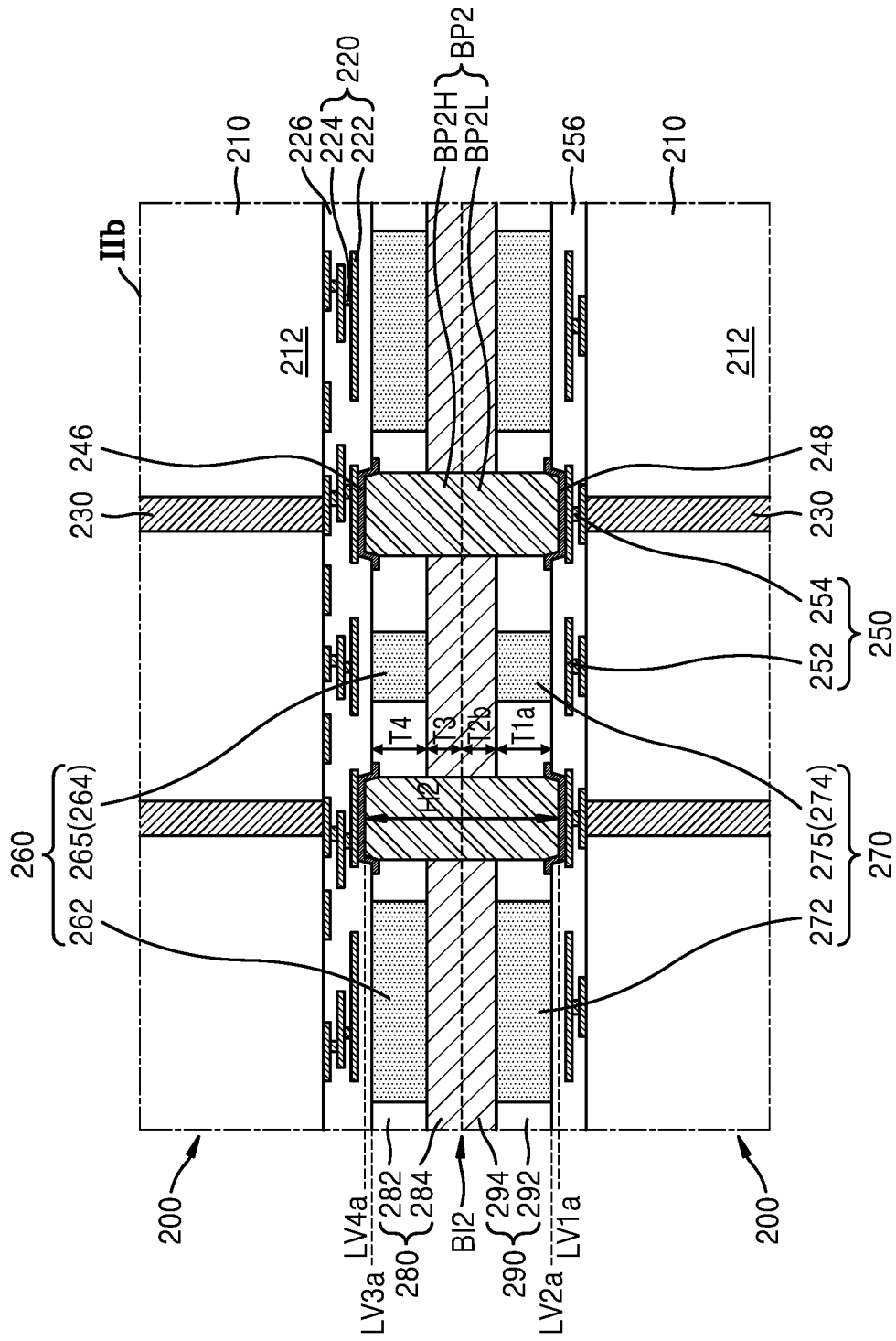

FIG. 1 is a cross-sectional view of a semiconductor package according to an embodiment, and FIGS. 2A and 2B are enlarged cross-sectional views thereof. FIGS. 2A and 2B are enlarged cross-sectional views of regions IIA and IIB in FIG. 1.

Referring to FIGS. 1 through 2B, a semiconductor package 1000 may include a first semiconductor chip 100 and a plurality of second semiconductor chips 200. In FIGS. 1 through 2A, the semiconductor package 1000 is illustrated to include four second semiconductor chips 200, but the embodiment is not limited thereto. For example, the semiconductor package 1000 may include two or more second semiconductor chips 200. In some embodiment, the semiconductor package 1000 may include a multiple of four second semiconductor chips 200. The second semiconductor chips 200 may be stacked on the first semiconductor chip 100. The semiconductor package 1000 may be referred to as a sub-semiconductor package.

The first semiconductor chip 100 in the semiconductor package 1000 may be electrically connected to the second semiconductor chip 200 closest to the first semiconductor chip 100, for example, the second semiconductor chip 200 at the lowest end of the second semiconductor chips 200 via a plurality of first bonded pads BP1, transceive signals, and provide power and a ground. Two of the second semiconductor chips 200 adjacent to each other of the second semiconductor chips 200 in the semiconductor package 1000 may be electrically connected to each other via a plurality of second connection pads BP2, and transceive signals, and provide or be provided with power and a ground.

The first semiconductor chip 100 may include a first semiconductor substrate 110 including a first active surface and a first inactive surface, which are formed to be opposite to each other, a first semiconductor element 112 formed on the first active surface of the first semiconductor substrate 110, a first front surface wiring structure 120 formed on the first active surface of the first semiconductor substrate 110, a plurality of first through electrodes 130 connected to the first front surface wiring structure 120 and penetrating at least a portion of the first semiconductor chip 100, and a first rear surface wiring structure 150 formed on the first inactive surface of the first semiconductor substrate 110 and connected to the first through electrodes 130. The first semiconductor chip 100 may further include a plurality of first front surface pads 142 connected to the first front surface wiring structure 120.

In the semiconductor package 1000, the first semiconductor chip 100 may be formed such that the first active surface of the first semiconductor substrate 110 faces a lower side, and the first inactive surface thereof faces an upper side. However, unless otherwise specified herein, the upper surface of the first semiconductor chip 100 in the semiconductor package 1000 may be referred to as a side toward which the first inactive surface of the first semiconductor substrate 110 faces, and the lower surface of the first semiconductor chip 100 may be referred to as a side toward which the first active surface of the first semiconductor substrate 110 faces. However, when descriptions are given with the first semiconductor chip 100 as a reference, the lower surface of the semiconductor chip 100 facing toward the first active surface of the first semiconductor substrate 110 may be referred to as a front surface of the first semiconductor chip 100, and the upper surface of the first semiconductor chip 100 facing the first inactive surface of the first semiconductor substrate 110 may be referred to as a rear surface of the first semiconductor chip 100.

The second semiconductor chip 200 may include a second semiconductor substrate 210 having a second active surface and a second inactive surface formed to be opposite to each other, a second semiconductor element 212 formed on the second active surface of the second semiconductor substrate 210, and a second front surface wiring structure 220 formed on the second active surface of the second semiconductor substrate 210.

The first and second active surfaces on which the first and second semiconductor elements 112 and 212 are formed may be active regions of the first and second semiconductor substrates 110 and 210, respectively. These first and second active regions may include a source/drain region and/or a channel region of a transistor.

The second semiconductor chip 200 may further include a plurality of second through electrodes 230 connected to the second front surface wiring structure 220 and penetrating at least a portion of the second semiconductor chip 200, and a second rear surface wiring structure 250 formed on the second inactive surface of the second semiconductor substrate 210 and connected to the second through electrodes 230. In some embodiment, of the second semiconductor chips 200, the second semiconductor chip 200 disposed farthest from the first semiconductor chip 100 and thus located on an uppermost end of the semiconductor package 1000 may not include the second through electrodes 230 and the second rear surface wiring structure 250. In some embodiment, of the second semiconductor chips 200, the second semiconductor chip 200 disposed farthest from the first semiconductor chip 100 and thus located on the uppermost end of the semiconductor package 1000 may have a thickness greater than a thickness of the other second semiconductor chips 200.

In the semiconductor package 1000, each of the second semiconductor chips 200 may be sequentially stacked in a vertical direction (Z direction) while the second active surface of each of the second semiconductor chips 200 faces toward the lower side, that is, the first semiconductor chip 100. Accordingly, when not particularly mentioned herein, the upper surface of the second semiconductor chip 200 in the semiconductor package 1000 may be referred to as a side toward which the second inactive surface of the second semiconductor substrate 210 faces, and the lower surface of the second semiconductor chip 200 may be referred to as a side toward which the second active surface of the second semiconductor substrate 210 faces. However, when descriptions are given with the second semiconductor chip 200 as a reference, the lower surface of the second semiconductor chip 200 facing toward the second active surface of the second semiconductor substrate 210 may be referred to as a front surface of the second semiconductor chip 200, and the upper surface of the second semiconductor chip 200 facing the second inactive surface of the second semiconductor substrate 210 may be referred to as a rear surface of the second semiconductor chip 200.

The first semiconductor substrate 110 and the second semiconductor substrate 210 may include, for example, a semiconductor material such as silicon (Si). Alternatively, the first semiconductor substrate 110 and the second semiconductor substrate 210 may include a semiconductor material such as germanium (Ge). Each of the first semiconductor substrate 110 and the second semiconductor substrate 210 may have an active surface and an inactive surface opposite to the active surface. The first semiconductor substrate 110 and the second semiconductor substrate 210 may include a conductive region, for example, a well doped with impurities. The first semiconductor substrate 110 and the second semiconductor substrate 210 may have various element isolation structures such as a shallow trench isolation (STI) structure.

Each of the first semiconductor element 112 and the second semiconductor element 212 may include a plurality of individual elements of various types. The individual elements may include various microelectronic elements, for example, a metal-oxide-semiconductor field effect transistor (MOSFET) such as a complementary metal-oxide-semiconductor (CMOS) transistor, an image sensor such as a system large scale integration (LSI) and CMOS imaging sensor (CIS), a micro-electro-mechanical system (MEMS), an active element, a passive element, etc. The individual elements may be electrically connected to the conductive region of the first semiconductor substrate 110 or the second semiconductor substrate 210. Each of the first semiconductor element 112 and the second semiconductor element 212 may further include at least two of the individual elements, or a conductive wiring or a conductive plug electrically connecting the individual elements to the conductive regions of each of the first semiconductor substrate 110 and the second semiconductor substrate 210. In addition, each of the individual elements may be electrically separated from other neighboring individual elements by an insulating layer.

In some embodiment, at least one of the first semiconductor chip 100 and the second semiconductor chip 200 may include a memory semiconductor chip. In some embodiment, at least one of the first semiconductor chip 100 and the second semiconductor chip 200 may include, for example, a central processing unit (CPU) chip, a graphics processing unit (GPU) chip, or an application processor (AP) chip.

In some embodiment, the semiconductor package 1000 including the first semiconductor chip 100 and the second semiconductor chip 200 may be referred to as a high bandwidth memory (HBM) dynamic random access memory (DRAM) semiconductor chip. For example, the first semiconductor chip 100 may include a buffer chip including a serial-parallel conversion circuit for controlling the second semiconductor chips 200, and the second semiconductor chips 200 may include a core chip including DRAM memory cells. In some embodiment, the first semiconductor chip 100 may be referred to as a master chip, and each of the second semiconductor chip 200 may be referred to as a slave chip.

The first front surface wiring structure 120 and the second front surface wiring structure 220 may include a material such as aluminum (Al), copper (Cu), and tungsten (W). In some embodiment, the first front surface wiring structure 120 and the second front surface wiring structure 220 may include a wiring barrier layer and a wiring metal layer. The wiring barrier layer may include a metal, metal nitride, or an alloy. The wiring metal layer may include at least one metal of W, Al, Ti, Ta, Ru, Mn, and Cu.

The second front surface wiring structure 220 may include a plurality of second front surface wiring patterns 222 and a plurality of second front surface wiring vias 224 connected to the second front surface wiring patterns 222. In some embodiment, the second front surface wiring pattern 222 may have a thickness equal to or less than about 0.5 μm. In some embodiment, the second front surface wiring structure 220 may have a multilayered wiring structure in which the second front surface wiring pattern 222 and the second front surface wiring via 224 are formed on different vertical levels from each other.

The second semiconductor chip 200 may include a second front surface inter-wiring insulating layer 226 surrounding the second front surface wiring structure 220. When the second front surface wiring structure 220 has a multilayer wiring structure, the second front surface inter-wiring insulating layer 226 may have a multilayer structure in which a plurality of insulating layers are stacked corresponding to the multilayer wiring structure of the second front surface wiring structure 220. For example, the second front surface inter-wiring insulating layer 226 may include silicon oxide (SiO), silicon nitride (SiN), silicon oxynitride (SiON), insulating polymer, or a combination thereof.

Similar to the case where the second semiconductor chip 200 includes the second front surface wiring structure 220 including the second front surface wiring patterns 222 and the second front surface wiring vias 224, and the second front surface inter-wiring insulating layer 226 surrounding the second front surface wiring structure 220, the first semiconductor chip 100 may include the first front surface wiring structure 120 including a plurality of first front surface wiring patterns and a plurality of first front surface wiring vias connected to the first front surface wiring patterns, and a first front surface inter-wiring insulating layer surrounding the first front surface wiring structure 120.

Each of the first through electrode 130 and the second through electrode 230 may include a through silicon via (TSV). Each of the first through electrode 130 and the second through electrode 230 may include a conductive plug penetrating each of the first semiconductor substrate 110 and the second semiconductor substrate 210, and a conductive barrier layer surrounding the conductive plug. The conductive plug may have a circular shape, and the conductive barrier layer may have a cylindrical shape surrounding a side wall of the conductive plug. A via insulating layer may be formed between the first through electrode 130 and the first semiconductor substrate 110, and between the second through electrode 230 and the second semiconductor substrate 210, and may surround the side walls of the first through electrode 130 and the second through electrode 230. The first through electrode 130 and the second through electrode 230 may be formed having any one of via-first, via-middle, and via-last structures.

The first rear surface wiring structure 150 and the second rear surface wiring structure 250 may include a material such as aluminum, copper, and tungsten. In some embodiment, the first rear surface wiring structure 150 and the second rear surface wiring structure 250 may include a wiring barrier layer and a wiring metal layer.

The first rear surface wiring structure 150 may include a plurality of first rear surface wiring patterns 152, and a plurality of first rear surface wiring vias 154 connected to the first rear surface wiring patterns 152. The second rear surface wiring structure 250 may include a plurality of second rear surface wiring patterns 252, and a plurality of second rear surface wiring vias 254 connected to the second rear surface wiring patterns 252. In some embodiment, each of the first rear surface wiring patterns 152 and the second rear surface wiring patterns 252 may have a thickness equal to or less than about 0.5 µm. In some embodiment, the first rear surface wiring structure 150 may have a multilayer wiring structure in which the first rear surface wiring patterns 152 and the first rear surface wiring vias 154 are at different vertical levels from each other, and the second rear surface wiring structure 250 may have a multilayer wiring structure in which the second rear surface wiring patterns 252 and the second rear surface wiring vias 254 are at different vertical levels from each other.

The first semiconductor chip 100 may include a first rear surface inter-wiring insulating layer 156 surrounding the first rear surface wiring structure 150, and the second semiconductor chip 200 may include a second rear surface inter-wiring insulating layer 256 surrounding the second rear surface wiring structure 250. When the first rear surface wiring structure 150 has a multilayer wiring structure, the first rear surface inter-wiring insulating layer 156 may have a multilayer structure in which a plurality of insulating layers are stacked corresponding to the multilayer wiring structure of the first rear surface wiring structure 150, and when the second rear surface wiring structure 250 has a multilayer wiring structure, the second rear surface inter-wiring insulating layer 256 may have a multilayer structure in which a plurality of insulating layers are stacked corresponding to the multilayer wiring structure of the second rear surface wiring structure 250.

For example, each of the first rear surface inter-wiring insulating layer 156 and the second rear surface inter-wiring insulating layer 256 may include SiO, SiN, SiON, insulating polymer, or a combination thereof. In some embodiment, a first front surface protection layer 140 and a second front surface protection layer 240 may include, for example, oxide, nitride, polymer, or a combination thereof. For example, at least a portion of each of the first rear surface inter-wiring insulating layer 156 and the second rear surface inter-wiring insulating layer 256 may include polymer formed of photosensitive polyimide (PSPI). For example, each of the first rear surface inter-wiring insulating layer 156 and the second rear surface inter-wiring insulating layer 256 may have a multilayer structure in which a layer including nitride and a layer formed of PSPI are stacked. Alternatively, for example, each of the first rear surface inter-wiring insulating layer 156 and the second rear surface inter-wiring insulating layer 256 may have a multilayer structure in which a layer including nitride and a layer formed of tetraethylorthosilicate (TEOS) are stacked. For example, each of the first rear surface inter-wiring insulating layer 156 and the second rear surface inter-wiring insulating layer 256 may have a thickness of about 2 µm to about 5 µm.

A first rear surface cover layer 190 may be formed on the first rear surface wiring structure 150. The first rear surface cover layer 190 may include a first lower rear surface cover layer 192 covering the first rear surface wiring structure 150, and a first upper rear surface cover layer 194 covering the first lower rear surface cover layer 192.

A second front surface cover layer 280 may be formed on the second front surface wiring structure 220. The second front surface cover layer 280 may include a second lower front surface cover layer 282 covering the second front surface wiring structure 220, and a second upper front surface cover layer 284 covering the second lower front surface cover layer 282.

A second rear surface cover layer 290 may be formed on the second rear surface wiring structure 250. The second rear surface cover layer 290 may include a second lower rear surface cover layer 292 covering the second rear surface wiring structure 250, and a second upper rear surface cover layer 294 covering the second lower rear surface cover layer 292.

Each of the first lower rear surface cover layer 192, the second lower front surface cover layer 282, and the second lower rear surface cover layer 292 may include at least one of SiO, SiN, silicon carbonitride (SiCN), and silicon oxycarbide (SiCO). Each of the first upper rear surface cover layer 194, the second upper front surface cover layer 284, and the second upper rear surface cover layer 294 may include at least one of SiO, SiN, SiCN, SiCO, and a polymer material. For example, the polymer material may include benzocyclobutene (BCB), polyimide (PI), polybenzoxazole (PBO), silicone, acrylate, or epoxy. In some embodiment, the first lower rear surface cover layer 192, the second lower front surface cover layer 282, and the second lower rear surface cover layer 292 may be formed of the same material, and the first upper rear surface cover layer 194, the second upper front surface cover layer 284, and the second upper rear surface cover layer 294 may be formed of the same material. In some embodiment, the material of the first lower rear surface cover layer 192, the second lower front surface cover layer 282, and the second lower rear surface cover layer 292 may be different from the material of the first upper rear surface cover layer 194, the second upper front surface cover layer 284, and the second upper rear surface cover layer 294.

A first rear surface dummy conductive layer 170 may be formed in the first rear surface cover layer 190, a second front surface dummy conductive layer 260 may be formed in the second front surface cover layer 280, and a second rear surface dummy conductive layer 270 may be formed in the second rear surface cover layer 290. The first rear surface dummy conductive layer 170, the second front surface dummy conductive layer 260, and the second rear surface dummy conductive layer 270 may be formed to penetrate the first lower rear surface cover layer 192, the second lower front surface cover layer 282, and the second lower rear surface cover layer 292, respectively. In some embodiment, an upper surface and a lower surface of each of a first rear surface dummy conductive layer 180, a second front surface dummy conductive layer 260, and the second rear surface dummy conductive layer 270 may be at the same vertical level to be coplanar with the upper surface and the lower surface of each of the first lower rear surface cover layer 192, the second lower front surface cover layer 282, and the second lower rear surface cover layer 292, respectively.

The first rear surface dummy conductive layer 170 may include at least one first rear surface alignment pattern 172 and a plurality of first rear surface dummy patterns 175. The second front surface dummy conductive layer 260 may include at least one second front surface alignment pattern 262 and a plurality of second front surface dummy patterns 265. The second rear surface dummy conductive layer 270 may include at least one second rear surface alignment pattern 272 and a plurality of second rear surface dummy patterns 275.

The first rear surface dummy conductive layer 170 and the second front surface dummy conductive layer 260 may be apart from each other with the first upper rear surface cover layer 194 and the second upper front surface cover layer 284 therebetween. The second rear surface dummy conductive layer 270 and the second front surface dummy conductive layer 260 may be apart from each other with the second upper rear surface cover layer 294 and the second upper front surface cover layer 284 therebetween. The first rear surface alignment pattern 172 and the second front surface alignment pattern 262 facing each other may overlap each other, and may be separated apart from each other with the first upper rear surface cover layer 194 and the second upper front surface cover layer 284 therebetween.

The first rear surface alignment pattern 172 and the second front surface alignment pattern 262 facing each other may have the same horizontal width, and the second rear surface alignment pattern 272 and the second front surface alignment pattern 262 may have the same horizontal width. The second rear surface alignment pattern 272 and the second front surface alignment pattern 262 facing each other may overlap each other, and may be apart from each other with the second upper rear surface cover layer 294 and the second upper front surface cover layer 284 therebetween.

An opening 174 and another opening 176 of the first rear surface dummy patterns 175 may have different horizontal widths. An opening 264 and another opening 266 of the second front surface dummy patterns 265 may have different horizontal widths. An opening 274 and another opening 276 of the second rear surface dummy patterns 275 may have different horizontal widths.

In some embodiment, each of at least one of the first rear surface alignment pattern 172 and the first rear surface dummy patterns 175 of the first rear surface dummy conductive layer 170, each of at least one of the second front surface alignment pattern 262 and the second front surface dummy patterns 265 of the second front surface dummy conductive layer 260, and each of at least one of the second rear surface alignment pattern 272 and the second rear surface dummy patterns 275 of the second rear surface dummy conductive layer 270 may be entirely surrounded by an insulating material and electrically floated. In some embodiment, an opening of at least one of the first rear surface alignment pattern 172 and the first rear surface dummy patterns 175 of the first rear surface dummy conductive layer 170, an opening of at least one of the second front surface alignment pattern 262 and the second front surface dummy patterns 265 of the second front surface dummy conductive layer 260, and an opening of at least one of the second rear surface alignment pattern 272 and the second rear surface dummy patterns 275 of the second rear surface dummy conductive layer 270 may be provided with a ground.

The first bonded pad BP1, the second through electrode 230, and the second connection pads BP2 corresponding to one another, with one first through electrode 130 as a reference, may be aligned in a vertical direction, and formed in a straight line extending in the vertical direction. The first through electrode 130 and the second through electrode 230 corresponding to each other may overlap the first bonded pad BP1 and the second connection pad BP2 corresponding to each other in the vertical direction.

Each of at least one of the first rear surface alignment pattern 172 and the first rear surface dummy patterns 175 in the first rear surface dummy conductive layer 170, each of at least one of the second front surface alignment pattern 262 and the second front surface dummy patterns 265 in the second front surface dummy conductive layer 260, and each of at least one of the second rear surface alignment pattern 272 and the second rear surface dummy patterns 275 in the second rear surface dummy conductive layer 270 may not overlap the first through electrodes 130 and the second through electrodes 230 in the vertical direction.

The first rear surface dummy conductive layer 170, the second front surface dummy conductive layer 260, and the second rear surface dummy conductive layer 270 may be separated apart from the first bonded pads BP1 and the second connection pads BP2. For example, the first rear surface alignment pattern 172 and the first rear surface dummy patterns 175 of the first rear surface dummy conductive layer 170 may be separated apart from one another in the horizontal direction with the first bonded pads BP1 and the first lower rear surface cover layer 192 therebetween. Similarly the second front surface alignment pattern 262 and the second front surface dummy patterns 265 of the second front surface dummy conductive layer 260 may be separated apart from one another in the horizontal direction with the first bonded pads BP2 and the second lower front surface cover layer 282 therebetween. In addition, the second rear surface alignment pattern 272 and the plurality second drear surface dummy patterns 275 of the second rear surface dummy conductive layer 270 may be separated apart from one another in the horizontal direction with the first bonded pads BP2 and the second lower rear surface cover layer 292 therebetween. Each of the first rear surface dummy conductive layer 170, the second front surface dummy conductive layer 260, and the second rear surface dummy conductive layer 270 may include a material including Cu, or a material including Al.

A plurality of first bonded pads BP1 may penetrate the first rear surface cover layer 190 and the second front surface cover layer 280, and may be electrically connected to the first through electrodes 130 and the second through electrodes 230 corresponding to each other.

The first bonded pads BP1 may extend into the first rear surface inter-wiring insulating layer 156, and one end of the first bonded pads BP1 may be electrically connected to the first rear surface wiring structure 150. The first bonded pads BP1 may extend into a second front surface inter-wiring insulating layer 226, and the other end of the first bonded pads BP1 may be electrically connected to the second front surface wiring structure 220.

A first rear surface under bump metal (UBM) layer 148 may be formed between one end of the first bonded pads BP1 and the first rear surface wiring structure 150, and a second front surface UBM layer 246 may be formed between the other end of the first bonded pads BP1 and the second front surface wiring structure 220. In some embodiment, one end of the first bonded pads BP1 may be in contact with the first rear surface wiring pattern 152 with the first rear surface UBM layer 148 therebetween, and the other end of the first bonded pads BP1 may be in contact with the second front surface wiring pattern 222 with the second front surface UBM layer 246 therebetween.

A portion of the first bonded pads BP1, which penetrates the first rear surface cover layer 190 and extends into the first rear surface inter-wiring insulating layer 156, may be referred to as a first lower pad unit BP1L, and a portion of the first bonded pads BP1, which penetrates the second front surface cover layer 280 and extends into the second front surface inter-wiring insulating layer 226, may be referred to as a first upper pad unit BP1H. The first lower pad unit BP1L and the first upper pad unit BP1H corresponding to each other may form one body.

The second connection pads BP2 may penetrate the second front surface cover layer 280 and the second rear surface cover layer 290, and may be electrically connected to the second through electrodes 230 which respectively correspond to the second semiconductor chips 200.

Each of the second connection pads BP2 may extend into the second rear surface inter-wiring insulating layer 256 of a second semiconductor chip 200 of the second semiconductor chips 200, and one end of each of the second connection pads BP2 may be electrically connected to the second rear surface wiring structure 250. In addition, each of the second connection pads BP2 may extend into the second front surface inter-wiring insulating layer 226 of another second semiconductor chip 200, vertically adjacent to the second semiconductor chip 200, of the second semiconductor chips 200, and the other end of each of the second connection pads BP2 may be electrically connected to the second front surface wiring structure 220.

A second semiconductor chip UBM layer 248 may be formed between one end of each of the second connection pads BP2 and the second rear surface wiring structure 250 of a second semiconductor chip 200 of the second semiconductor chips 200, and the second front surface UBM layer 246 may be formed between the other end of each of the second connection pads BP2 and the second front surface wiring structure 220 of another second semiconductor chip 200, vertically adjacent to the second semiconductor chip 200, of the second semiconductor chips 200. In some embodiment, one end of each of the second connection pads BP2 may contact the second semiconductor chip UBM layer 248, and may contact the second rear surface wiring pattern 252 of the second semiconductor chip 200 of the second semiconductor chips 200, and the other end of each of the second connection pads BP2 may contact the second front surface UBM layer 246 and may contact the second front surface wiring pattern 222 of the other second semiconductor chip 200 of the second semiconductor chips 200.

A portion of each of the second bonded pads BP2, which penetrates the second rear surface cover layer 290 and extends into the second rear surface inter-wiring insulating layer 256, may be referred to as a second lower pad unit BP2L, and a portion of each of the second bonded pads BP2, which penetrates the second front surface cover layer 280 and extends into the second front surface inter-wiring insulating layer 226, may be referred to as a second upper pad unit BP2H. The second lower pad unit BP2L and the second upper pad unit BP2H corresponding to each other may form one body.

For example, the first bonded pads BP1 and the second connection pads BP2 may include a material including Cu.

Each of the first bonded pads BP1 may be formed by separately forming a portion penetrating the first rear surface cover layer 190 of the first semiconductor chip 100 and a portion penetrating the second front surface cover layer 280 of the second semiconductor chip 200, then expanding by using heat and bonding these portions, and then performing diffusion bonding such that these portions form one body by using diffusion of metal atoms in these portions. Each of the second bonded pads BP2 may be formed by separately forming a portion penetrating the second rear surface cover layer 290 of a second semiconductor chip 200 of the second semiconductor chips 200 and a portion penetrating the second front surface cover layer 280 of another second semiconductor chip 200, vertically adjacent to the second semiconductor chip 200, of the second semiconductor chips 200, then expanding by using heat and bonding these portions, and then performing diffusion bonding such that these portions form one body by using diffusion of metal atoms in these portions.

In some embodiment, the first upper rear surface cover layer 194 of the first semiconductor chip 100 and the second upper front surface cover layer 284 of the second semiconductor chip 200 contacting each other may be bonded to each other in a process of forming the first bonded pads BP1 to form an integrated first bonding cover layer BIL and the second upper rear surface cover layer 294 and the second upper front surface cover layer 284 of each of two second semiconductor chips 200 contacting each other may be bonded to each other in a process of forming the second bonded pads BP2 to form an integrated second bonding cover layer BI2.

The first lower rear surface cover layer 192 may have a first thickness T1, and the first upper rear surface cover layer 194 may have a second thickness T2. The first thickness T1 may have a value equal to or greater than the second thickness T2. For example, the first thickness T1 may have a value of about 50% to about 70% of a sum of the first thickness T1 and the second thickness T2. The second upper front surface cover layer 284 may have a third thickness T3, and the second lower front surface cover layer 282 may have a fourth thickness T4. The fourth thickness T4 may have a value equal to or greater than the third thickness T3. For example, the fourth thickness T4 may have a value of about 50% to about 70% of a sum of the third thickness T3 and the fourth thickness T4. The second lower rear surface cover layer 292 may have a fifth thickness T1a, and the second upper rear surface cover layer 294 may have a sixth thickness T2a. The fifth thickness T1a may have a value equal to or greater than the sixth thickness T2a. For example, the fifth thickness T1a may have a value of about 50% to about 70% of a sum of the fifth thickness T1a and the sixth thickness T2a.

In some embodiment, the first thickness T1 and the fifth thickness T1a may be substantially the same, and the second thickness T2 and the sixth thickness T2a may be substantially the same. In some embodiment, the first thickness T1 and the fourth thickness T4 may be substantially the same, and the second thickness T2 and the third thickness T3 may be substantially the same. For example, each of the first thickness T1, the fourth thickness T4, and the fifth thickness T1a may range from about 0.2 μm to about 1 μm. For example, a sum of the first thickness T1, the second thickness T2, the third thickness T3, and the fourth thickness T4 may range from about 0.7 μm to about 4 μm. For example, a sum of the fifth thickness T1a, the sixth thickness T2a, the third thickness T3, and the fourth thickness T4 may range from about 0.7 μm to about 4 μm.

A lower surface of the first bonded pad BP1 may be at a first vertical level LV1, a lower surface of the first rear surface dummy conductive layer 170 may be at a second vertical level LV2 higher than the first vertical level LV1, an upper surface of the second front surface dummy conductive layer 260 of the second semiconductor chip 200 adjacent to the first semiconductor chip 100 may be at a third vertical level LV3 higher than the second vertical level LV2, and an upper surface of the first bonded pad BP1 may be at a fourth vertical level LV4 higher than the third vertical level LV3.

Between two second semiconductor chips 200 adjacent to each other, a lower surface of the second connection pad BP2 may be at a fifth vertical level LV1a, a lower surface of the second rear surface dummy conductive layer 270 may be at a sixth vertical level LV2a higher than the fifth vertical level LV1a, an upper surface of the second front surface dummy conductive layer 260 may be at a seventh vertical level LV3a higher than the sixth vertical level LV2a, and an upper surface of the second connection pad BP2 may be at an eighth vertical level LV4a higher than the seventh vertical level LV3a. In some embodiment, a height of each of the second vertical level LV2, a third level LV3, and a fourth level LV4 with the first vertical level LV1 as a reference may be substantially the same as a height of each of the sixth vertical level LV2a, a seventh level LV3a, and an eighth level LV4a with the fifth vertical level LV1a as a reference.

The first bonded pad BP1 may have a first height H1, and the second connection pad BP2 may have a second height H2. In some embodiment, the first height H1 and the second height H2 may be substantially the same. For example, each of the first height H1 and the second height H2 may range from about 0.8 μm to about 4.2 μm. Each of the first bonded pad BP1 and the second connection pad BP2 may have a horizontal width ranging from about 0.5 μm to about 8 μm.

The first rear surface dummy conductive layer 170 may have the first thickness T1, the second front surface dummy conductive layer 260 may have the fourth thickness T4, and the second rear surface dummy conductive layer 270 may have the fifth thickness T1a. In some embodiment. a sum of the first thickness T1, the second thickness T2, the third thickness T3, and the fourth thickness T4 may be smaller than the first height H1, and a sum of the fifth thickness T1a, the sixth thickness T2a, the third thickness T3, and the fourth thickness T4 may be smaller than the second height H2. In some embodiment, the first height H1 may be the same as or smaller than twice a sum of the first thickness T1 and the fourth thickness T4, and the second height H2 may be the same as or smaller than twice a sum of the fifth thickness T1a and the fourth thickness T4. Each of the first rear surface alignment pattern 172, the second front surface alignment pattern 262, and the second rear surface alignment pattern 272 may have a horizontal width ranging from about 20 μm to about 50 μm. Each of the first rear surface dummy pattern 175, the second front surface dummy pattern 265, and the second rear surface dummy pattern 275 may have a horizontal width that is smaller than a horizontal width of each of the first rear surface alignment pattern 172, the second front surface alignment pattern 262, and the second rear surface alignment pattern 272.

Both the first rear surface dummy conductive layer 170 and the first bonded pad BP1 may overlap each other in the horizontal direction, and both the second front surface dummy conductive layer 260 and the first bonded pad BP1 or the second connection pad BP2 may overlap each other in the horizontal direction, and both the second rear surface dummy conductive layer 270 and the second connection pad BP2 may overlap each other in the horizontal direction.

In the semiconductor package 1000 according to the embodiment, the first rear surface dummy conductive layer 170 and the second front surface dummy conductive layer 260 corresponding to each other may be separated apart from each other with the first bonding cover layer BI1 including the first upper rear surface cover layer 194 and the second upper front surface cover layer 284 therebetween, and the second front surface dummy conductive layer 260 and the second rear surface dummy conductive layer 270 corresponding to each other may be separated apart from each other with the second bonding cover layer BI2 including the second upper rear surface cover layer 294 and the second upper front surface cover layer 284 therebetween. It is noted here that, in a process of forming the first rear surface alignment pattern 172, the second front surface alignment pattern 262, and the second rear surface alignment pattern 272 having relatively large widths, one or more recesses having a relatively large depth equal to or greater than 100 Å may be generated due to dishing phenomenon. However, by filling the recesses with the first upper rear surface cover layer 194, the second upper front surface cover layer 284, and the second upper rear surface cover layer 294, formation of voids inside the semiconductor package 1000 may be prevented, and thus, the reliability of the semiconductor package 1000 may be improved.

FIGS. 3A through 3G are cross-sectional views illustrating in sequence a manufacturing method of a semiconductor package, according to embodiments. FIGS. 3A through 3G are enlarged cross-sectional views of portions corresponding to region IIa in FIG. 1.

Figure 3A:
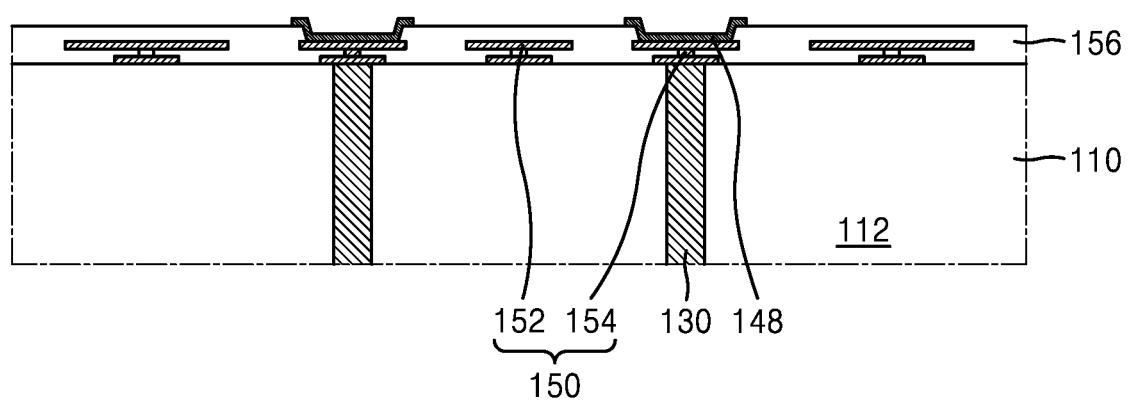
FIGS. 3A through 3G are cross-sectional views illustrating in sequence a manufacturing method of a semiconductor package, according to embodiments.

Referring to FIG. 3A, the first rear surface wiring structure 150 connected to the first through electrodes 130, the first semiconductor element 112, and the first through electrodes 130 may be formed in the first semiconductor substrate 110.

The first through electrodes 130 may penetrate the first semiconductor substrate 110. The first semiconductor element 112 may be formed on the first active surface of the first semiconductor substrate 110, and the first rear surface wiring structure 150 may be formed on the first inactive surface of the first semiconductor substrate 110.

The first rear surface wiring structure 150 may include the first rear surface wiring patterns 152, and the first rear surface wiring vias 154 connected to the first rear surface wiring patterns 152, and may be surrounded by the first rear surface inter-wiring insulating layer 156. The first rear surface wiring structure 150 may be formed to connect the first through electrodes 130 to a portion of the first rear surface wiring patterns 152. A portion of the first rear surface inter-wiring insulating layer 156 may be removed to expose another portion of the first rear surface wiring patterns 152. A first rear surface UBM layer 148 may be formed on the other portion of the first rear surface wiring patterns 152, which is not covered by the first rear surface inter-wiring insulating layer 156 but exposed. The first rear surface UBM layer 148 may be formed to cover the other portion of the first rear surface wiring patterns 152 together with a portion of the first rear surface inter-wiring insulating layer 156 adjacent thereto. In some embodiment, the lowest level of the upper surface of the first rear surface UBM layer 148 may be lower than a level of the upper surface of the first rear surface inter-wiring insulating layer 156.

Figure 3B:
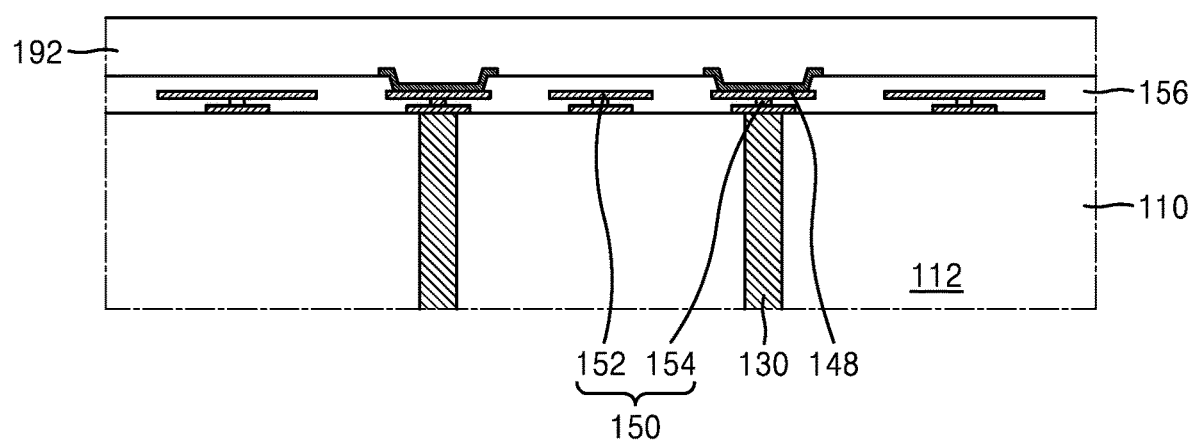

Referring to FIG. 3B, the first lower rear surface cover layer 192 covering the first rear surface wiring structure 150, the first rear surface inter-wiring insulating layer 156, and the first rear surface UBM layer 148 may be formed. The first lower rear surface cover layer 192 may include at least one of SiO, SiN, SiCN, and SiCO. The first lower rear surface cover layer 192 may be formed to have a thickness ranging from about 0.2 µm to about 1 µm.

Figure 3C:
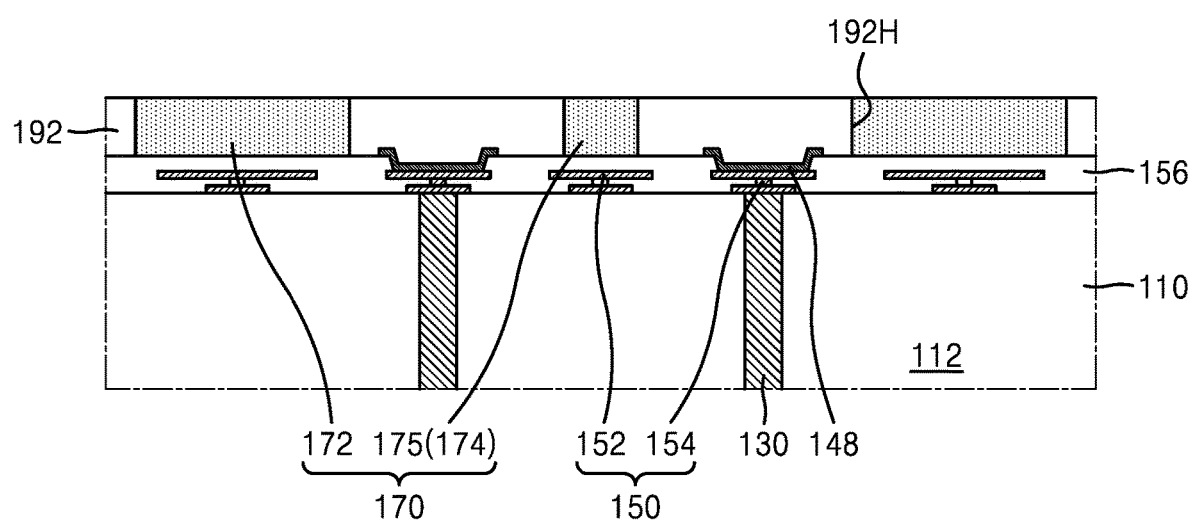

Referring to FIG. 3C, a plurality of first holes 192H are formed to expose the first rear surface inter-wiring insulating layer 156 on a lower surface of the first hole 192H by removing a portion of the first lower rear surface cover layer 192, and the first rear surface dummy conductive layer 170 may be formed to fill the first holes 192H. The first rear surface dummy conductive layer 170 may include at least one first rear surface alignment pattern 172 and the first rear surface dummy patterns 175. The opening 174 and the other opening 176 of the first rear surface dummy patterns 175 may have different horizontal widths from each other. The first rear surface dummy conductive layer 170 may include a material including Cu or Al. At least one first rear surface alignment pattern 172 may have a horizontal width ranging from about 20 µm to about 50 µm. The first rear surface dummy patterns 175 may have various different horizontal widths.

In some embodiment, the first rear surface dummy conductive layer 170 may be formed by filling out the first holes 192H with a first conductive material layer, and then performing a damascene process of removing a portion of the first conductive material layer so that an upper surface of the first lower rear surface cover layer 192 is exposed.

Figure 3D:
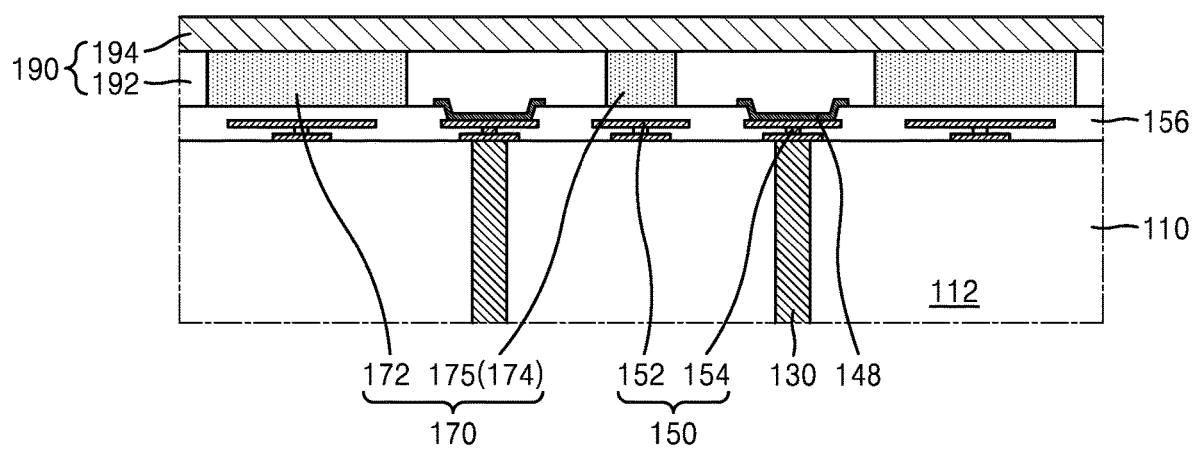

Referring to FIG. 3D, the first upper rear surface cover layer 194 covering the first lower rear surface cover layer 192 and the first rear surface dummy conductive layer 170 may be formed. The first upper rear surface cover layer 194 may include at least one of SiO, SiN, SiCN, SiCO, and polymer material. The first upper rear surface cover layer 194 may be formed to have a thickness the same as or smaller than a thickness of the first lower rear surface cover layer 192.

The first lower rear surface cover layer 192 and the first upper rear surface cover layer 194 may together be referred to as the first rear surface cover layer 190. In some embodiment, when the first lower rear surface cover layer 192 and the first upper rear surface cover layer 194 include the same material, the first lower rear surface cover layer 192 and the first upper rear surface cover layer 194 may not be differentiated from each other, and the first rear surface cover layer 190 may be formed as one body through a damascene process.

Figure 3E:
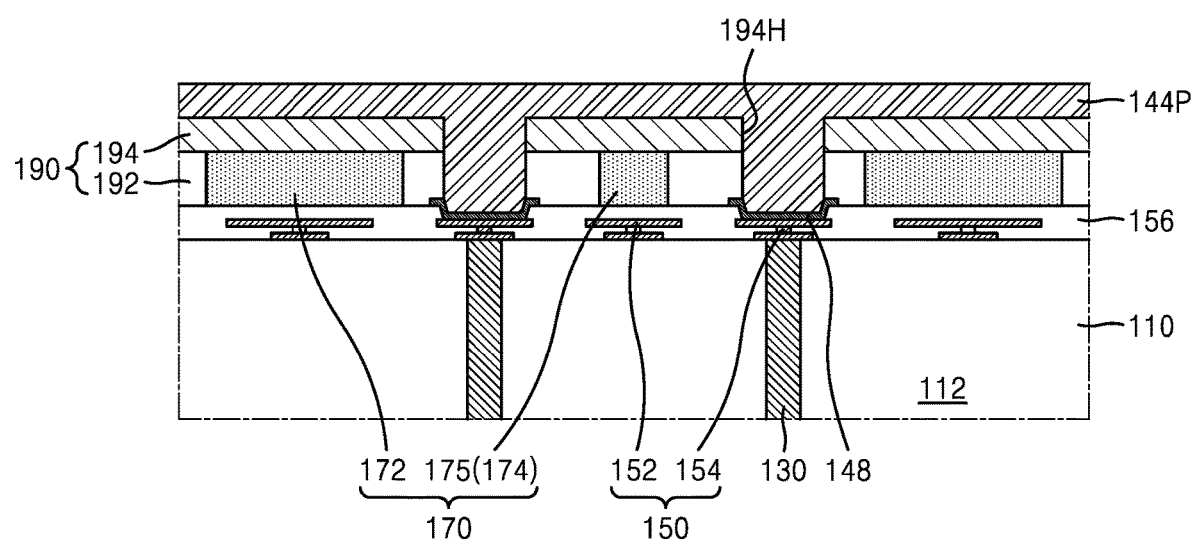

Referring to FIG. 3E, portions of the first upper rear surface cover layer 194 and the first lower rear surface cover layer 192 may be removed to form a plurality of second holes 194H exposing the first rear surface UBM layer 148 on a lower surface of the second hole 194H, and a second conductive material layer 144P may fill out the second holes 194H to cover the first upper rear surface cover layer 194. Each of the second holes 194H may have a horizontal width ranging from about 0.5 µm to about 8 µm. The second conductive material layer 144P may be formed of a material including Cu.

Figure 3F:
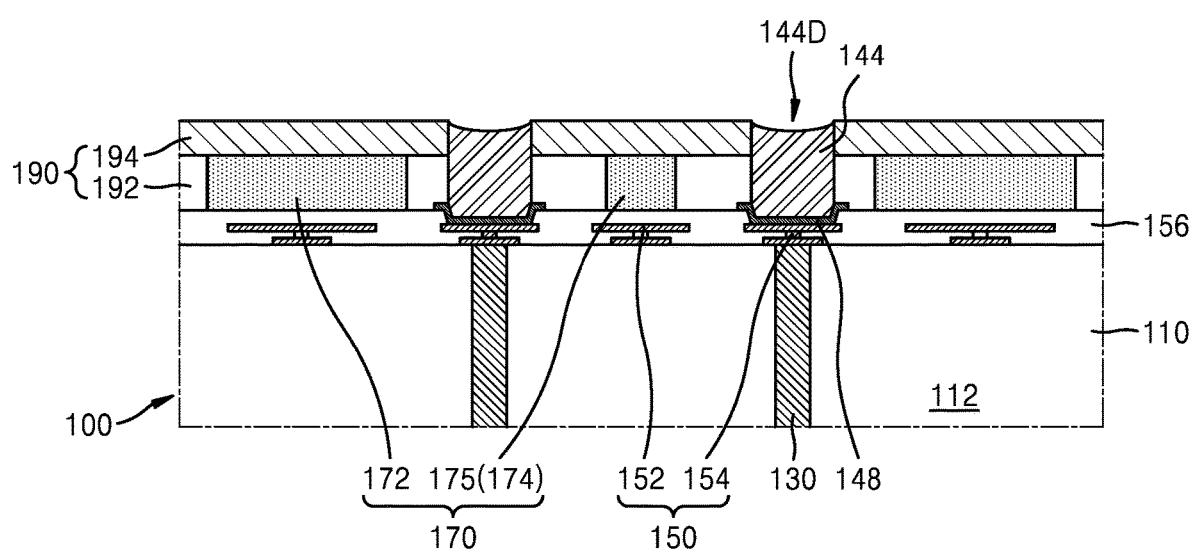

Referring to FIGS. 3E and 3F, a dicing process may be performed to remove a portion of the second conductive material layer 144P so the upper surface of the first upper rear surface cover layer 194 is exposed, and the first semiconductor chip 100 including a plurality of first rear surface connection pads 144 filling the second holes 194H may be formed.

In some embodiment, in a process of forming the first rear surface connection pads 144, a dishing phenomenon may occur such that the second conductive material layer 144P is overly removed below the upper surface of the first upper rear surface cover layer 19, and thus, a first dishing dent 144D on an upper surface of the first rear surface connection pads 144 may be formed. In some embodiment, the lowest portion of the upper surface of the first rear surface connection pads 144 may be lower than the upper surface of the first upper rear surface cover layer 194 by about 40 Å to about 80 Å.

Figure 3G:
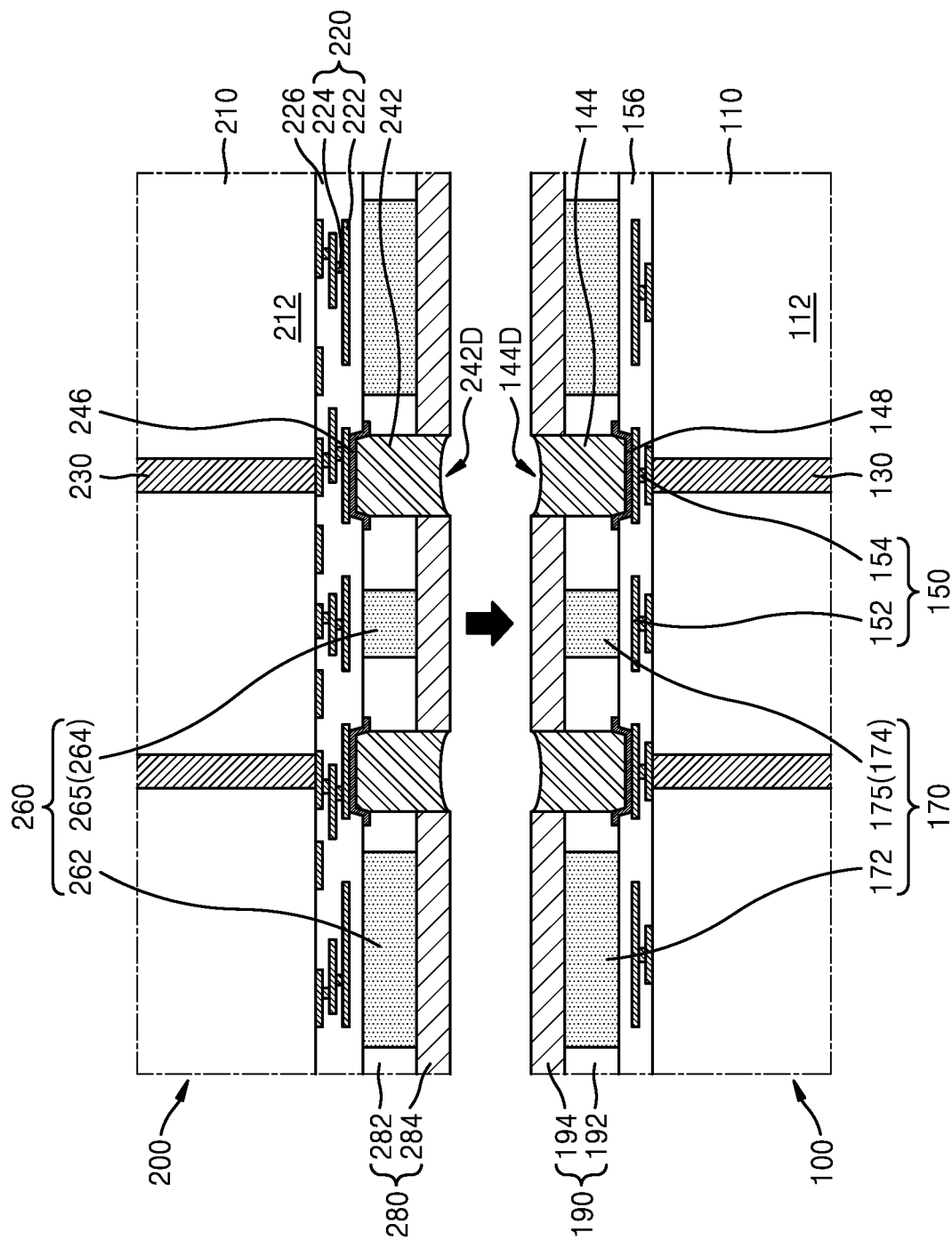

Referring to FIG. 3G, by referring to the manufacturing method described with reference to FIGS. 3A through 3F, the second semiconductor chip 200 may be prepared. The second semiconductor chip 200 may include the second front surface cover layer 280 including the second lower front surface cover layer 282 covering the second front surface wiring structure 220 and the second upper front surface cover layer 284 covering the second lower front surface cover layer 282, the second front surface dummy conductive layer 260 penetrating the second lower front surface cover layer 282 and including at least one second front surface alignment pattern 262 and the second front surface dummy patterns 265, and a plurality of second front surface connection pads 242 penetrating the second front surface cover layer 280 and connected to the second front surface UBM layer 246.

Thereafter, the second semiconductor chip 200 may be attached to the first semiconductor chip 100 such that the first upper rear surface cover layer 194 and the second upper front surface cover layer 284 contact each other, and the first rear surface connection pads 144 and the second front surface connection pads 242 correspond to each other. By applying heat and/or pressure in a process of attaching the second semiconductor chip 200 on the first semiconductor chip 100, the first upper rear surface cover layer 194 and the second upper front surface cover layer 284 may be bonded to each other. In some embodiment, the first upper rear surface cover layer 194 and the second upper front surface cover layer 284 may be bonded in a shared combination. In some other embodiment, the first upper rear surface cover layer 194 and the second upper front surface cover layer 284 may constitute the first bonding cover layer BI1 that is integrated. For example, heat at a first temperature may be applied in a process of attaching the second semiconductor chip 200 to the first semiconductor chip 100.

Thereafter, by applying heat at a second temperature higher than the first temperature, the first rear surface connection pads 144 and the second front surface connection pads 242 are bonded to each other. After the first rear surface connection pads 144 and the second front surface connection pads 242 corresponding to each other are expanded by heat and bonded to each other, the first bonded pads BP1 may be formed which have been diffusion bonded to result in one body by using diffusion of metal atoms included therein.

The first rear surface connection pads 144 may correspond to the first lower pad unit BP1L of the first bonded pads BP1, and the second front surface connection pads 242 may correspond to the first upper pad unit BP1H of the first bonded pads BP1.

The second front surface UBM layer 246, the second front surface cover layer 280, the second front surface dummy conductive layer 260, and the second front surface connection pads 242 formed on the second active surface of the second semiconductor substrate 210 may be formed in a similar method to the first rear surface UBM layer 148, the first rear surface cover layer 190, the first rear surface dummy conductive layer 170, and the first rear surface connection pads 144 formed on the first inactive surface of the first semiconductor substrate 110, respectively. The second front surface connection pads 242 may also include a second dishing unit 242D, similar to the first dishing dent 144D in the first rear surface connection pads 144.

In addition, portions corresponding to the second rear surface semiconductor chip UBM layer 248, the second rear surface cover layer 290, the second rear surface dummy conductive layer 270, and the second lower pad units BP2L, which are illustrated in FIG. 2B, may be formed in a similar method to the first rear surface connection pads 144 corresponding to the first rear surface UBM layer 148, the first rear surface cover layer 190, the first rear surface dummy conductive layer 170, and the first lower pad units BP1L, which are formed on the first inactive surface of the first semiconductor substrate 110. Further, the second bonded pads BP2 may also be formed in a similar method to the first bonded pads BP1, and thus, the semiconductor package 1000 illustrated in FIGS. 1 through 2B may be formed.

Referring to FIGS. 1 through 3G together, even when one or more recesses having a relatively large depth of about 100 Å are generated due to a dishing phenomenon in a process of forming the first rear surface alignment pattern 172, the second front surface alignment pattern 262, and the second rear surface alignment pattern 272, the recesses may be filled by the first upper rear surface cover layer 194, the second upper front surface cover layer 284, and the second upper rear surface cover layer 294, and thus, formation of voids inside the semiconductor package 1000 may be prevented, and the reliability of the semiconductor package 1000 may be improved, according to embodiments.

Figure 4:
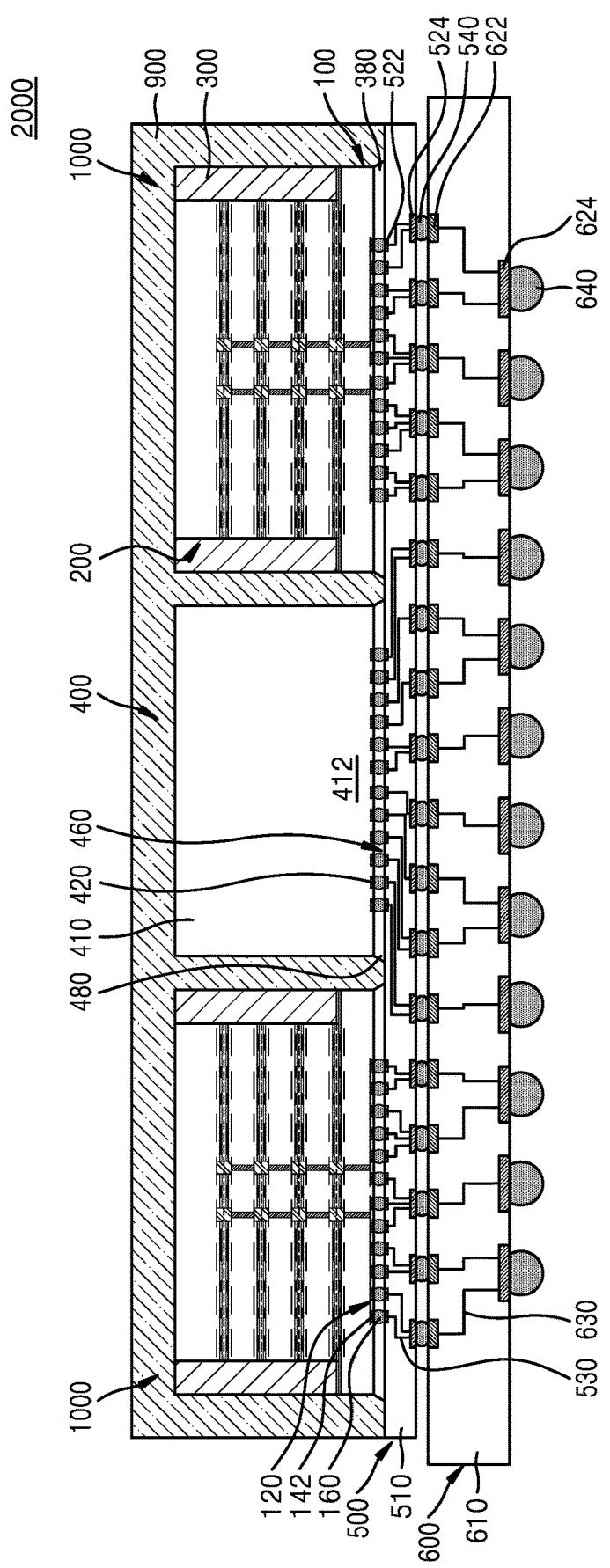
FIG. 4 is a cross-sectional view of a semiconductor package according to an embodiment.

FIG. 4 is a cross-sectional view of a semiconductor package 2000 according to an embodiment.

Referring to FIG. 4, the semiconductor package 2000 may include a main board 600 with an interposer 500 mounted thereon, at least one sub-semiconductor package 1000 attached to the interposer 500 and including the first semiconductor chip 100 and the second semiconductor chips 200, and a third semiconductor chip 400. The sub-semiconductor package 1000 may be the semiconductor package 1000 illustrated in FIG. 1, and descriptions on the sub-semiconductor package 1000 are given with reference to FIG. 1 together. In addition, the semiconductor package 2000 may be referred to as a system.

The sub-semiconductor package 1000 may be attached to the interposer 500 via a plurality of first connection bumps 160. The first connection bumps 160 may be attached to the first front surface pads 142, and may be electrically connected to the first front surface wiring structure 120 of the first semiconductor chip 100. The first connection bumps 160 may provide at least one of signals, power, or a ground for the sub-semiconductor package 1000.

In FIG. 4, the semiconductor package 2000 is illustrated to include two sub-semiconductor packages 1000. For example, the semiconductor package 2000 may include one sub-semiconductor package 1000, or three or more sub-semiconductor packages 1000.

The third semiconductor chip 400 may include a third semiconductor substrate 410 with a third semiconductor element 412 formed on an active surface thereof, and a plurality of upper surface connection pads 420. In some embodiment, each of the upper surface connection pads 420 may include at least one of Al, Cu, and Ni. The third semiconductor chip 400 may be attached to the interposer 500 via a plurality of second connection bumps 460. The second connection bumps 460 may be attached to the upper surface connection pads 420. The third semiconductor chip 400 may include, for example, a central processing unit (CPU) chip, a graphics processing unit (GPU) chip, or an application processor (AP) chip.

The third semiconductor substrate 410 may be a component generally similar to the first semiconductor substrate 110 or the second semiconductor substrate 210 illustrated in FIG. 1, the third semiconductor element 412 may be a component generally similar to the first semiconductor element 112 or the second semiconductor element 212 illustrated in FIG. 1, and the second connection bump 460 may be a component generally similar to the first connection bump 160, and thus, detailed descriptions thereof are omitted.

The interposer 500 may include a base layer 510, a plurality of first upper surface pads 522 and a plurality of first lower surface pads 524 respectively formed on an upper surface and a lower surface of the base layer 510, and a plurality of first wiring paths 530 electrically connecting the first upper surface pad 522 to the first lower surface pad 524 via the base layer 510. The base layer 510 may include a semiconductor material, glass, ceramic, or plastic. For example, the base layer 510 may include silicon. The first wiring paths 530 may include an internal penetrating electrode electrically connecting the first upper surface pads 522 to the first lower surface pads 524 in a wiring layer and/or the base layer 510 connected to the first upper surface pads 522 and/or the first lower surface pads 524 respectively on the upper surface and/or the lower surface of the base layer 510. The first upper surface pads 522 may be connected to the first connection bumps 160 electrically connecting the sub-semiconductor package 1000 to the interposer 500, and the second connection bumps 460 electrically connecting the third semiconductor chip 400 to the interposer 500.

A first underfill layer 380 may be formed between the semiconductor package 1000 and the interposer 500, and a second underfill layer 480 may be formed between the third semiconductor chip 400 and the interposer 500. The first underfill layer 380 and the second underfill layer 480 may surround the first connection bump 160 and the second connection bump 460, respectively.

The semiconductor package 2000 may further include a package molding layer 900 surrounding side surfaces of the sub-semiconductor package 1000 and the third semiconductor chip 400 on the interposer 500. The package molding layer 900 may include, for example, an epoxy mold compound (EMC). In some embodiment, the package molding layer 900 may cover upper surfaces of the sub-semiconductor package 1000 and the third semiconductor chip 400. In some other embodiment, the package molding layer 900 may not cover the upper surfaces of the sub-semiconductor package 1000 and the third semiconductor chip 400. For example, a heat dissipating member may be attached to the upper surfaces of the sub-semiconductor package 1000 and the third semiconductor chip 400 with a thermal interface material (TIM) therebetween.

A plurality of board connection terminals 540 may attached to the first lower surface pads 524. The board connection terminals 540 may electrically connect the interposer 500 to the main board 600.

The main board 600 may include a base board layer 610, a plurality of second upper surface pads 622 and a plurality of second lower surface pads 624 respectively formed on an upper surface and a lower surface of the base board layer 610, and a plurality of second wiring paths 630 electrically connecting the second upper surface pads 622 to the second lower surface pads 624 via the base board layer 610.

In some embodiment, the main board 600 may include a printed circuit board. For example, the main board 600 may include a multi-layer printed circuit board. The base board layer 610 may include at least one material of phenol resin, epoxy resin, and polyimide.

A solder resist layer (not illustrated) exposing the second upper surface pads 622 and the second lower surface pads 624 may be formed on the upper surface and the lower surface of the base board layer 610, respectively. The board connection terminals 540 may be connected to the second upper surface pads 622, and the external connection terminals 640 may be connected to the second lower surface pads 624. The board connection terminals 540 may electrically connect the first lower surface pads 524 to the second upper surface pads 622. The external connection terminals 640 connected to the second lower surface pads 624 may be connected to the outside of the semiconductor package 2000.

In some embodiment, the semiconductor package 2000 may not include the main board 600, and the board connection terminal 540 may perform a function of an external connection terminal.

Figure 5:
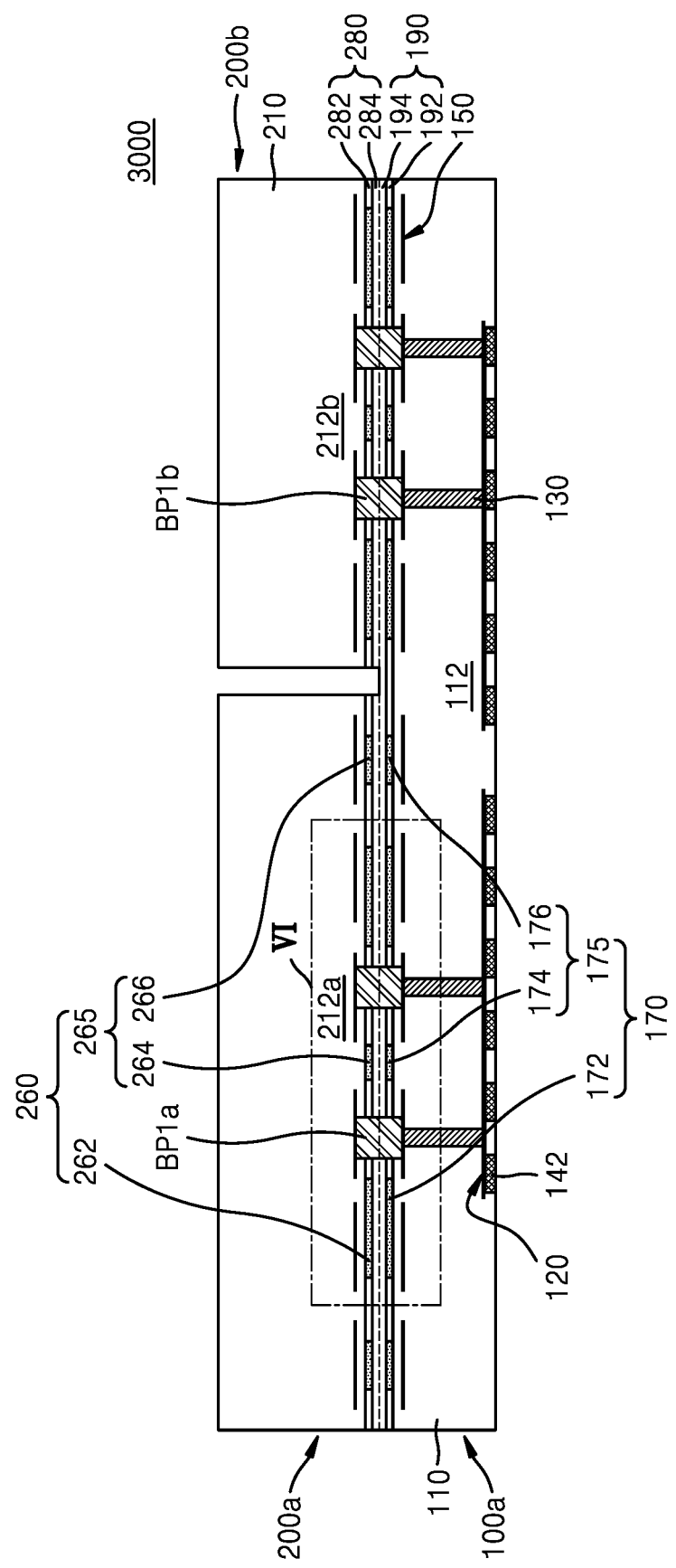
FIG. 5 is a cross-sectional view of a semiconductor package according to an embodiment.
Figure 6:
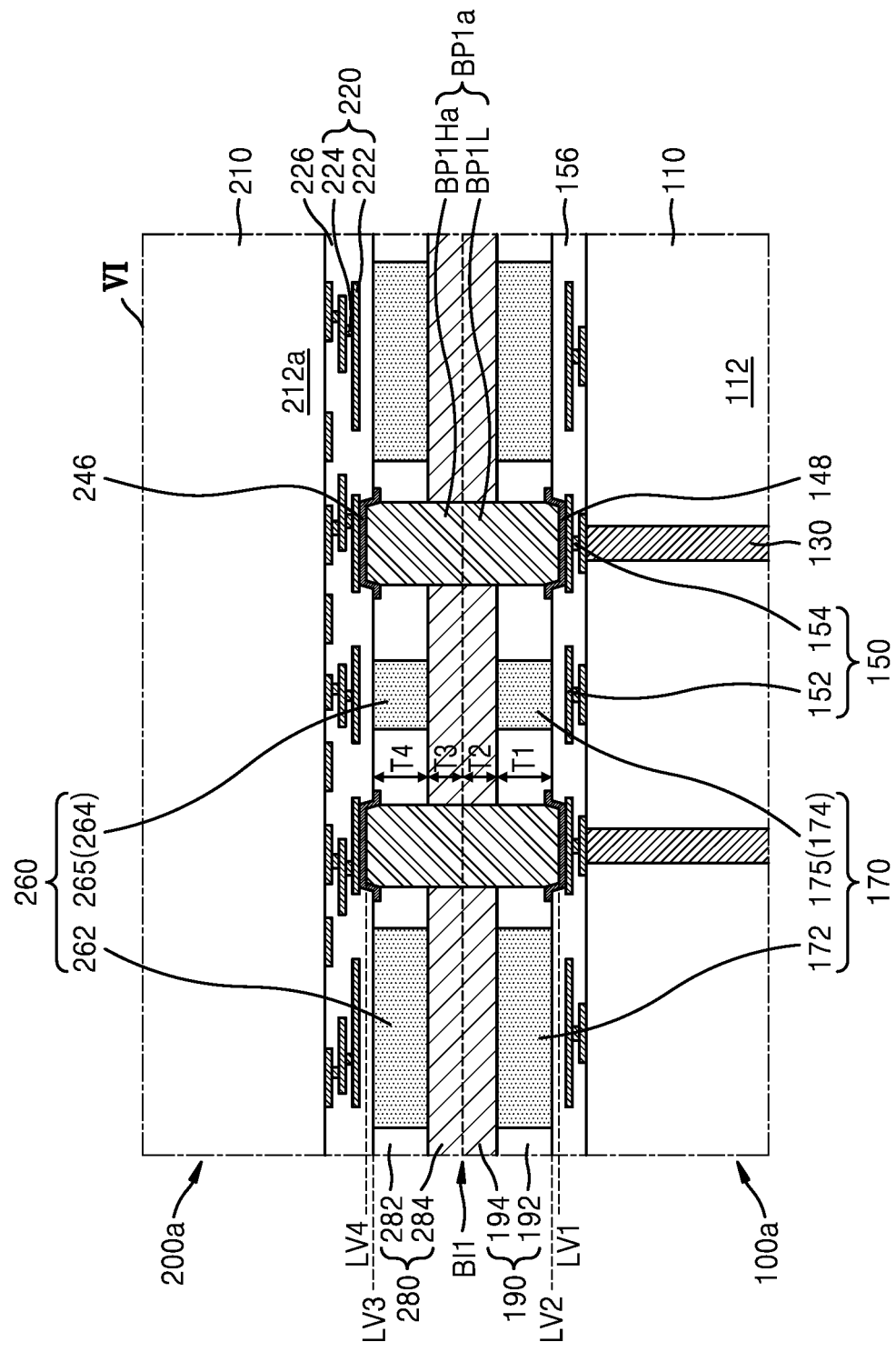
FIG. 6 is an enlarged cross-sectional view thereof.

FIG. 5 is a cross-sectional view of a semiconductor package 3000 according to an embodiment, and FIG. 6 is an enlarged cross-sectional view thereof. FIG. 6 is an enlarged cross-sectional view of region VI in FIG. 5. In FIGS. 5 and 6, duplicate descriptions given with reference to FIGS. 1 through 2B are omitted.

Referring to FIGS. 5 and 6, a semiconductor package 3000 may include a first semiconductor chip 100a and at least one second semiconductor chip 200a/200b. The semiconductor package 3000 may be referred to as a sub-semiconductor package. The at least one second semiconductor chip 200a/200b may include a second even semiconductor chip 200a and a second odd semiconductor chip 200b. Each of the second even semiconductor chip 200a and the second odd semiconductor chip 200b may be attached onto the first semiconductor chip 100a. In some embodiment, the second even semiconductor chip 200a and the second odd semiconductor chip 200b may be apart from each other, and may be stacked on the first semiconductor chip 100a. In some embodiment, the second even semiconductor chip 200a and the second odd semiconductor chip 200b may include semiconductor chips of the same type. In some other embodiment, the second even semiconductor chip 200a and the second odd semiconductor chip 200b may include semiconductor chips of a different type.

In FIG. 5, the semiconductor package 3000 is illustrated to include one first semiconductor chip 100 and two second semiconductor chips 200a/200b, that is, the second even semiconductor chip 200a and the second odd semiconductor chip 200b, but the embodiment is only exemplary, and is not limited thereto. In some embodiment, the semiconductor package 3000 may include one second semiconductor chip mounted on one first semiconductor chip. In some other embodiment, the semiconductor package 3000 may include three or more second semiconductor chips mounted on one first semiconductor chip. In some another embodiment, the semiconductor package 3000 may include one, or two or more second semiconductor chips stacked over two or more first semiconductor chips.

The first semiconductor chip 100a may be the same as the first semiconductor chip 100 illustrated in FIGS. 1 through 2A, except that the first semiconductor chip 100a includes a plurality of first even bonded pads BP1a and a plurality of first odd bonded pads BP1b respectively corresponding to the second semiconductor chip 200a and the second semiconductor chip 200b so that two or more second semiconductor chips 200a/200b, for example, second even semiconductor chips 200a and second odd semiconductor chips 200b, are attached to an upper surface of the first semiconductor chip 100a, and thus, detailed descriptions thereof are omitted.

In each of the first even bonded pads BP1a, a portion penetrating the first rear surface cover layer 190 and extending into the first rear surface inter-wiring insulating layer 156 may be referred to as the first lower pad unit BP1L, and a portion penetrating the second front surface cover layer 280 of the second even semiconductor chip 200a and extending into the second front surface inter-wiring insulating layer 226 may be referred to as a first even upper pad unit BP1Ha. The first lower pad unit BP1L and the first even upper pad unit BP1Ha corresponding to each other may form one body. Although not separately illustrated, each of a plurality of first odd bonded pads BP1b may include the first lower pad unit BP1L and a first odd upper pad unit, which form one body.

The second even semiconductor chip 200a and the second odd semiconductor chip 200b may include a second even semiconductor element 212a and a second odd semiconductor element 212b, respectively, and may be generally similar to or the same as the second semiconductor chip 200, which does not include the second through electrode 230, on the uppermost end of the second semiconductor chips 200 illustrated in FIG. 1, and thus, detailed descriptions thereof are omitted. The second even semiconductor element 212a and the second odd semiconductor element 212b may be the same as or similar to the second semiconductor element 212 illustrated in FIGS. 1 through 2B.

In some embodiment, the second even semiconductor chip 200a and the second odd semiconductor chip 200b may include semiconductor chips of the same type. In some other embodiment, the second even semiconductor chip 200a and the second odd semiconductor chip 200b may include semiconductor chips of a different type.

Figure 7:
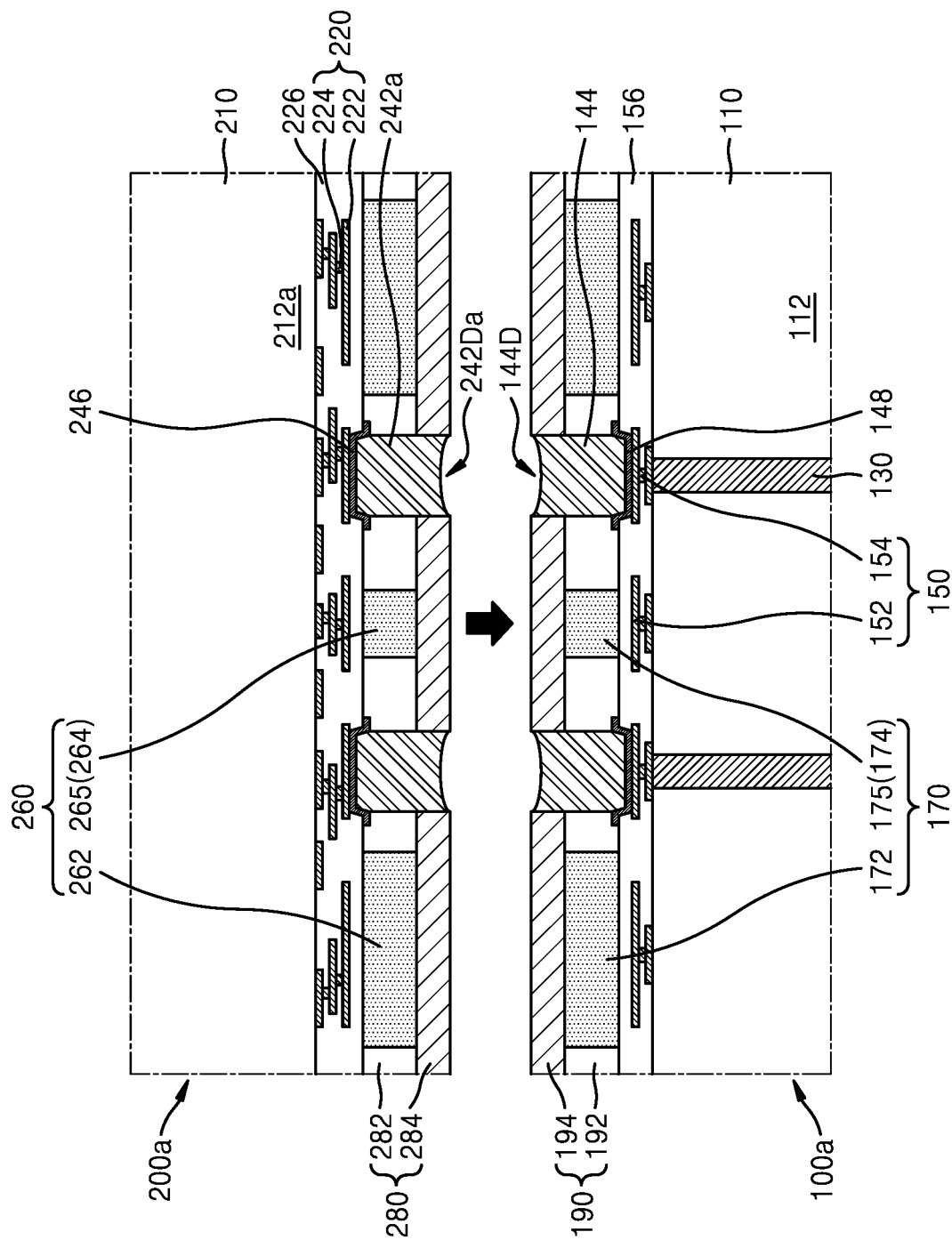
FIG. 7 is a cross-sectional view illustrating a manufacturing method of a semiconductor package, according to an embodiment.

FIG. 7 is a cross-sectional view illustrating a manufacturing method of a semiconductor package, according to an example embodiment. FIG. 7 is an enlarged cross-sectional view of region VI in FIG. 5.

Referring to FIG. 7, in a manner similar to descriptions given with reference to FIGS. 3A through 3G, the second even semiconductor chip 200a may be prepared. The second even semiconductor chip 200a may include the second front surface cover layer 280, in which the second lower front surface cover layer 282 covering the second front surface wiring structure 220, and the second upper front surface cover layer 284 covering the second lower front surface cover layer 282. The second even semiconductor chip 200a may also include the second front surface dummy conductive layer 260 penetrating the second lower front surface cover layer 282 and including at least one second front surface alignment pattern 262 and the second front surface dummy patterns 265. Further, the second even semiconductor chip 200a may include a plurality of even front surface connection pads 242a penetrating the second front surface cover layer 280 and connected to the second front surface UBM layer 246. The first rear surface connection pads 144 may correspond to the first lower pad unit BP1L of the first bonded pads BP1, and the second front surface connection pads 242 may correspond to the first even upper pad unit BP1Ha of the first even bonded pads BP1a. The second even front surface connection pads 242a may also include a second even dishing dent 242Da, similar to the first dishing dent 144D in the first rear surface connection pads 144.

Thereafter, the second even semiconductor chip 200a may be attached to the first semiconductor chip 100a such that the first upper rear surface cover layer 194 and the second upper front surface cover layer 284 contact each other, and the first rear surface connection pads 144 and the second even front surface connection pads 242a correspond to each other. The first rear surface connection pads 144 and the second even front surface connection pads 242a corresponding to each other may be bonded to each other, and form the first even bonded pads BP1a.

Similarly to attaching the second semiconductor chip 200a on the first semiconductor chip 100a, the second odd semiconductor chip 200b may be attached on the first semiconductor chip 100a, and may form the first odd bonded pads BP1b illustrated in FIG. 5.

Figure 8:
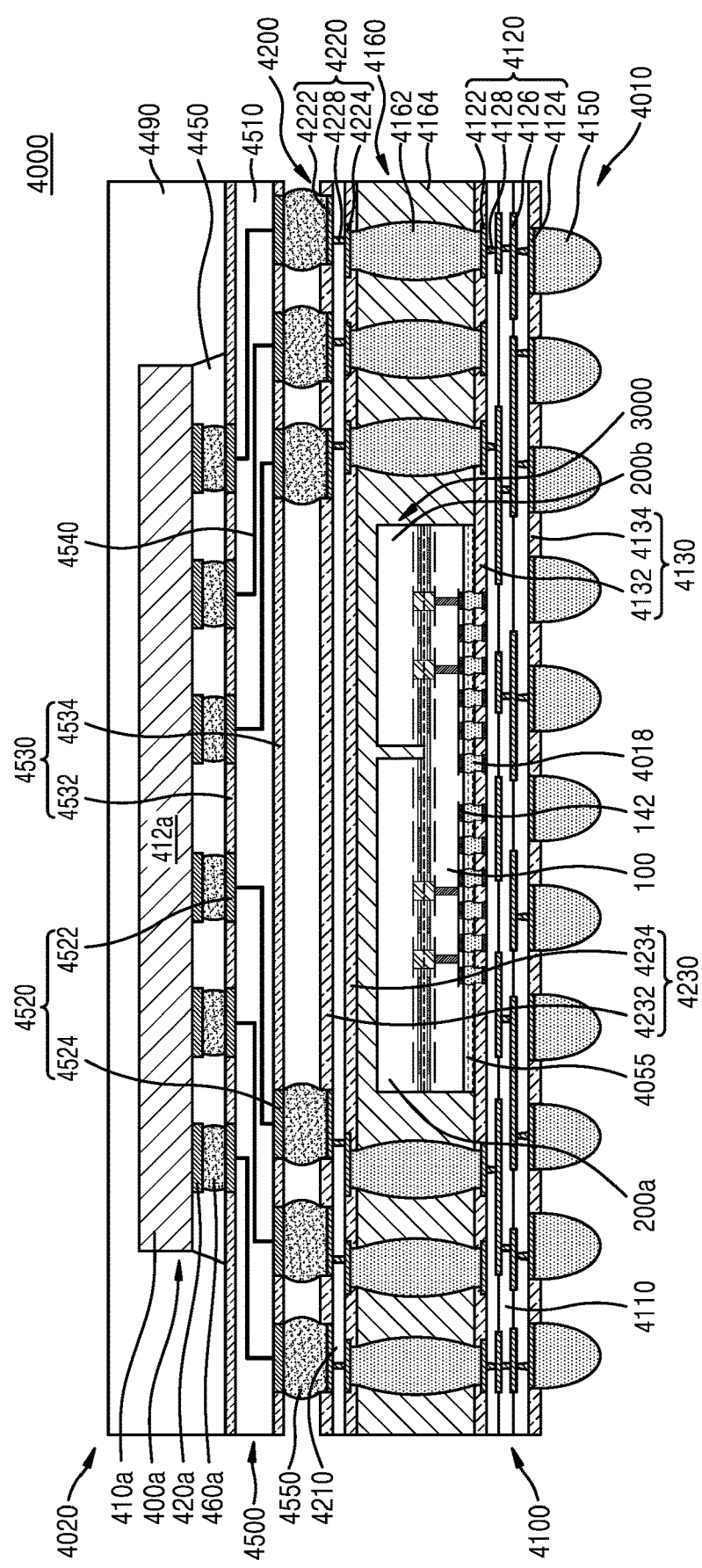
FIGS. 8 and 9 are cross-sectional views of semiconductor packages according to embodiments.
Figure 9:
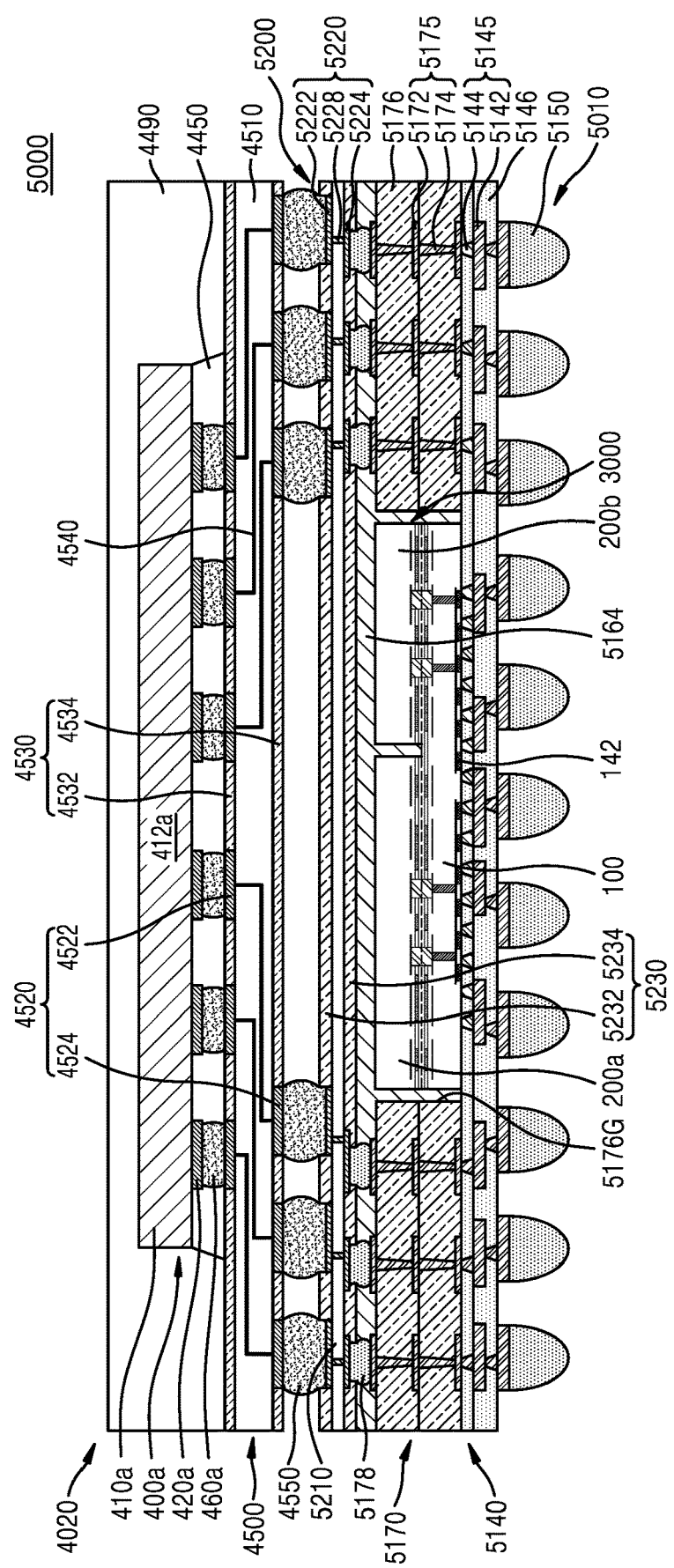

FIGS. 8 and 9 are cross-sectional views of semiconductor packages 4000 and 5000, according to embodiments, respectively.

Referring to FIG. 8, the semiconductor package 4000 may include an upper semiconductor package 4020 stacked on a lower semiconductor package 4010. The semiconductor package 4000 may be a package on package (PoP).

The lower semiconductor package 4010 may include a support wiring structure 4100, an expansion layer 4160 formed on the support wiring structure 4100, a sub-semiconductor package 3000 formed in the expansion layer 4160, and a cover wiring structure 4200 formed on the expansion layer 4160. The sub-semiconductor package 3000 may be the semiconductor package 3000 illustrated in FIGS. 5 and 6.

The lower semiconductor package 4010 may include a fan-out semiconductor package in which each of the support wiring structure 4100 and the cover wiring structure 4200 has a horizontal width and a plan area greater than a horizontal width and a plan area of the sub-semiconductor package 3000, respectively. In some embodiment, the horizontal widths and the plan area of the support wiring structure 4100 may be the same as the horizontal width and the plan area of the cover wiring structure 4200. In some embodiment, corresponding side surfaces of the support wiring structure 4100, the expansion layer 4160, and the cover wiring structure 4200 may be coplanar with each other.

The support wiring structure 4100 may be referred to as a lower wiring structure or a first wiring structure, and the cover wiring structure 4200 may be referred to as an upper wiring structure or a second wiring structure.

The support wiring structure 4100 and the cover wiring structure 4200 may include, for example, a printed circuit board, a ceramic board, a package manufacturing wafer, or an interposer. In some embodiment, the support wiring structure 4100 and the cover wiring structure 4200 may include a multi-layer printed circuit board. When the support wiring structure 4100 includes a printed circuit board (PCB), the support wiring structure 4100 may be referred to as a support PCB, or a lower PCB, or a first PCB. When the cover wiring structure 4200 includes a PCB, the cover wiring structure 4200 may also be referred to as a cover PCB, an upper PCB, or a second PCB.

The support wiring structure 4100 may include at least one first base insulating layer 4110 and a plurality of first wiring patterns 4120. The cover wiring structure 4200 may include at least one second base insulating layer 4210 and a plurality of second wiring patterns 4220. The first base insulating layer 4110 and the second base insulating layer 4210 may include at least one of phenol resin, epoxy resin, and polyimide.

The first wiring patterns 4120 may include a first upper surface wiring pattern, that is formed on an upper surface of at least one first base insulating layer 4110 and includes a plurality of first upper surface pads 4122, a first lower surface wiring pattern, that is formed on a lower surface of the first base insulating layer 4110 and includes a plurality of first lower surface pads 4124, and a plurality of first conductive vias 4128 that penetrate at least one first base insulating layer 4110 and electrically connect the first wiring patterns 4120 formed on different wiring layers in the first base insulating layer 4110. In some embodiment, when the support wiring structure 4100 includes the first base insulating layers 4110, the first wiring pattern 4120 may further include a first internal wiring pattern 4126 that forms a wiring layer between two first base insulating layers 4110 adjacent to each other.

The second wiring patterns 4220 may include a second upper surface wiring pattern that is formed on an upper surface of the at least one second base insulating layer 4210 and includes a plurality of second upper surface pads 4222, a second lower surface wiring pattern that is formed on the lower surface of the at least one second base insulating layer 4210 and includes a plurality of second lower surface pads 4224, and a plurality of second conductive vias 4228 that penetrate the at least one second base insulating layer 4210 and electrically connect the second wiring patterns 4220 to each other on different wiring. The first wiring pattern 4120 and the second wiring pattern 4220 may include at least one of Cu, Ni, stainless steel, and beryllium copper.

The support wiring structure 4100 may further include a first solder resist layer 4130 on upper and lower surfaces thereof. The first solder resist layer 4130 may include a first upper surface solder resist layer 4132 that covers an upper surface of at least one first base insulating layer 4110 and exposes a first upper surface pad 4122, and a first lower surface solder resist layer 4134 that covers a lower surface of the at least one first base insulating layer 4110 and exposes a first lower surface pad 4124. In some embodiment, the first lower surface solder resist layer 4134 may be formed, but the first upper surface solder resist layer 4132 may not be formed.

The cover wiring structure 4200 may further include a second solder resist layer 4230 on upper and lower surfaces thereof. The second solder resist layer 4230 may include a second upper surface solder resist layer 4232 that covers an upper surface of the at least one second base insulating layer 4210 and exposes a second upper pad 4222 of the second upper surface wiring patterns, and a second lower surface solder resist layer 4234 that covers a lower surface of the at least one second base insulating layer 4210 and exposes the second lower surface pad 4224 of the second lower surface wiring patterns.

A plurality of first chip connection terminals 4018 may be formed between the first upper surface pads 4122 and the first front surface pads 142, and electrically connect the sub-semiconductor package 3000 to the support wiring structure 4100. For example, the first chip connection terminals 4018 may include solder balls or bumps. In some embodiment, an underfill layer 4055 surrounding the first chip connection terminals 4018 may be formed between the sub-semiconductor package 3000 and the support wiring structure 4100. In some embodiment, the underfill layer 4055 may include a non-conductive film (NCF).

The semiconductor package 4000 may include a plurality of external connection terminals 4150 attached to the first lower surface pads 4124. For example, a height of each of the external connection terminals 4150 may be about 150 μm. For example, the external connection terminals 4150 may include solder balls.

The expansion layer 4160 may include a plurality of connection structures 4162, a filling member 4164 surrounding the connection structures 4162 and the sub-semiconductor package 3000. The filling member 4164 may fill a space between the support wiring structure 4100 and the cover wiring structure 4200, and surround the sub-semiconductor package 3000. The connection structures 4162 may be separated apart from the sub-semiconductor package 3000, and formed around the sub-semiconductor package 3000. The connection structures 4162 may penetrate the filling member 4164, and electrically connect a space between the support wiring structure 4100 and the cover wiring structure 4200. Upper and lower ends of each of the connection structures 4162 may contact and be connected to any one of the second bottom pads 4224 of the cover wiring structure 4200 and any one of a plurality of first upper surface pads 4122 of the support wiring structure 4100.

The upper semiconductor package 4020 may include at least one third semiconductor chip 400a. The upper semiconductor package 4020 may be electrically connected to the lower semiconductor package 4010 via a plurality of package connection terminals 4550 attached to the second upper surface pads 4222 of the lower semiconductor package 4010.

The third semiconductor chip 400a may include a third semiconductor substrate 410a including a third semiconductor element 412a formed on an active surface thereof, and a plurality of chip connection pads 420a formed on the active surface of the third semiconductor substrate 410a. At least one third semiconductor chip 400a may include a memory semiconductor chip.

In FIG. 8, at least one third semiconductor chip 400a in the upper semiconductor package 4020 is illustrated as being mounted on a package base substrate 4500 in a flip chip method, but the embodiment is exemplary and is not limited thereto. The semiconductor package 4000 may include, as an upper semiconductor package, a semiconductor package of all types that includes at least one third semiconductor chip 400a and the package connection terminal 4550 is attachable to a lower side of the semiconductor package 4000 to be electrically connected to the lower semiconductor package 4010.

The package base substrate 4500 may include a base board layer 4510, and a plurality of board pads 4520 arranged on upper and lower surfaces of the base board layer 4510. The board pads 4520 may include a plurality of board upper pads 4522 formed on the upper surface of the base board layer 4510 and a plurality of board lower pads 4524 formed on the lower surface of the base board layer 4510. In some embodiment, the package base substrate 4500 may include a PCB. On the upper and lower surfaces of the base board layer 4510, a board solder resist layer 4530 exposing the board pads 4520 may be formed. The board solder resist layer 4530 may include an upper board solder resist layer 4532 that covers the upper surface of the base board layer 4510 and exposes the board upper surface pads 4522, and a lower board solder resist layer 4534 that covers the lower surface of the base board layer 4510 and exposes the board lower surface pads 4524.

The package base substrate 4500 may include a board wiring 4540 electrically connecting the board upper surface pads 4522 to the board lower surface pads 4524 in the base board layer 4510. The board wiring 4540 may include a board wiring line and a board wiring via.

The board upper surface pads 4522 may be electrically connected to the third semiconductor chip 400a. For example, a plurality of second chip connection terminals 460a may be formed between the chip connection pads 420a of the third semiconductor chip 400a and the board upper surface pads 4522 of the package base substrate 4500, and may electrically connect the third semiconductor chip 400a to the package base substrate 4500. In some embodiment, a second under-fill layer 4450 surrounding the second chip connection terminals 460a may be formed between the third semiconductor chip 400a and the package base substrate 4500. The second under-fill layer 4450 may include, for example, epoxy resin formed by using a capillary under-fill method.

A molding layer 4490 surrounding the third semiconductor chip 400a may be formed on the package base substrate 4500. The molding layer 4490 may include, for example, an epoxy mold compound (EMC).

Referring to FIG. 9, the semiconductor package 5000 may include an upper semiconductor package 4020 stacked on a lower semiconductor package 5010. The upper semiconductor package 4020 is substantially the same as the upper semiconductor package 4020 described with reference to FIG. 8, and thus, detailed descriptions thereof are omitted.

The lower semiconductor package 5010 may include a support wiring structure 5140, an expansion layer 5170 formed on the support wiring structure 5140 and including a mounting space 5176G, the sub-semiconductor package 3000 formed in the mounting gap 5176G, and a cover wiring structure 5200 formed on the expansion layer 5170. The expansion layer 5170 may surround the periphery of the sub-semiconductor package 3000. The sub-semiconductor package 3000 may be the semiconductor package 3000 illustrated in FIGS. 5 and 6.

The lower semiconductor package 5010 may include a fan-out semiconductor package. In some embodiment, the expansion layer 5170 may include a panel board, and the lower semiconductor package 5010 may be a fan-out panel level package (FOPLP). For example, the lower semiconductor package 5010 may be a chip first FOPLP in which the support wiring structure 5140 is formed after the cover wiring structure 5200 is attached on the expansion layer 5170. The support wiring structure 5140 may be referred to as a redistribution layer.

In some embodiment, a horizontal width and a planar area of the mounting space 5176G may be greater than a horizontal width and a planar area of a footprint constituted by the sub-semiconductor package 3000. A side surface of the sub-semiconductor package 3000 may be separated apart from an internal surface of the mounting space 5176G.

The support wiring structure 5140 may include a redistribution conductive structure 5145 and a plurality of redistribution insulating layers 5146. The redistribution conductive structure 5145 and the redistribution insulating layer 5146 may be referred to as a first wiring pattern and a first base insulating layer, respectively. The redistribution conductive structure 5145 may include a plurality of redistribution line patterns 5142 formed on at least one of upper and lower surfaces of each of the redistribution insulating layers 5146, and a plurality of redistribution vias 5144 that penetrate at least one redistribution insulating layer 5146 of the redistribution insulating layers 5146 and are in contact with and connected to some of the redistribution line patterns 5142. In some embodiment, at least some of the redistribution line patterns 5142 may be formed, together with some of the redistribution vias 5144, in one body. In some embodiment, the redistribution vias 5144 may have a tapered shape, in which a horizontal width is decreased in an upward direction. In other words, the redistribution vias 5144 may have a greater horizontal width away from the first semiconductor chip 100. The first front surface pads 142 of the sub-semiconductor package 3000 may be electrically connected to the redistribution conductive structure 5145.

The expansion layer 5170 may include, for example, a PCB, a ceramic substrate, a package manufacturing wafer, or an interposer. In some embodiment, the expansion layer 5170 may include a multi-layer PCB. The mounting space 5176G may be formed as an opening or a cavity in the expansion layer 5170. The mounting space 5176G may be formed in some region, for example, the center region of the expansion layer 5170. The mounting space 5176G may be recessed from an upper surface of the expansion layer 5170 to a certain depth, or may be formed to extend from the upper surface of the expansion layer 5170 to a lower surface of the expansion layer 5170 and be opened. The expansion layer 5170 may include a plurality of connection structures 5175 and at least one substrate base 5176. The connection structure 5175 may include a connection wiring pattern 5172 and a connection conductive via 5174.

The lower semiconductor package 5010 may further include a filling member 5164 filling a space between the sub-semiconductor package 3000 and the expansion layer 5170, and a space between the expansion layer 5170 and the cover wiring structure 5200. The filling member 5164 may surround the sub-semiconductor package 3000. The filling member 5164 may include, for example, epoxy mold compound (EMC).

On the expansion layer 5170, the cover wiring structure 5200 including a second wiring pattern 5220 electrically connected to the connection structure 5175 may be formed. The cover wiring structure 5200 may include at least one second base insulating layer 5210 and the second wiring patterns 5220. The second wiring patterns 5220 may include a second upper surface wiring pattern that is arranged on an upper surface of the at least one second base insulating layer 5210 and includes a plurality of second upper surface pads 5222, a second lower surface wiring pattern that is arranged on the lower surface of the at least one second base insulating layer 5210 and includes a plurality of second lower surface pads 5224, and a plurality of second conductive vias 5228 that penetrate the at least one second base insulating layer 5210 and electrically connect the second wiring patterns 5220 to each other which are formed on different wiring layers. In some embodiment, a plurality of internal connection terminals 5178 may be formed between the connection structure 5175 and the second lower surface pads 5224, and may electrically connect the connection structure 5175 to the second wiring pattern 5220.

Figure 10A:
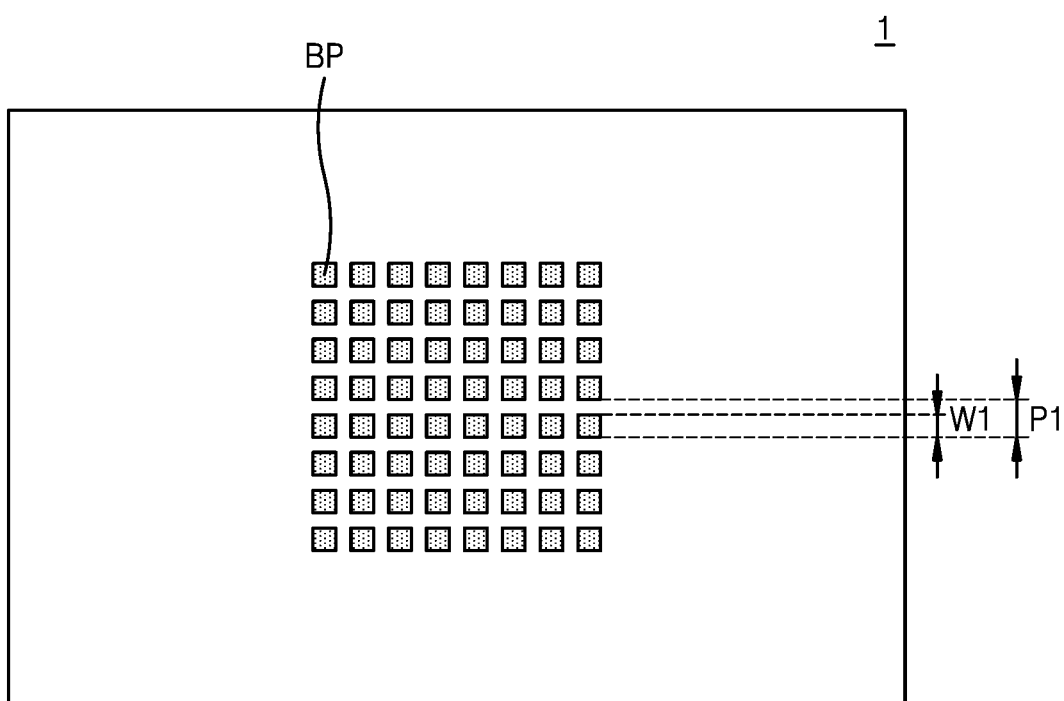
FIGS. 10A and 10B are plan views of a plurality of bonded pads in a semiconductor package, according to embodiments.
Figure 10B:
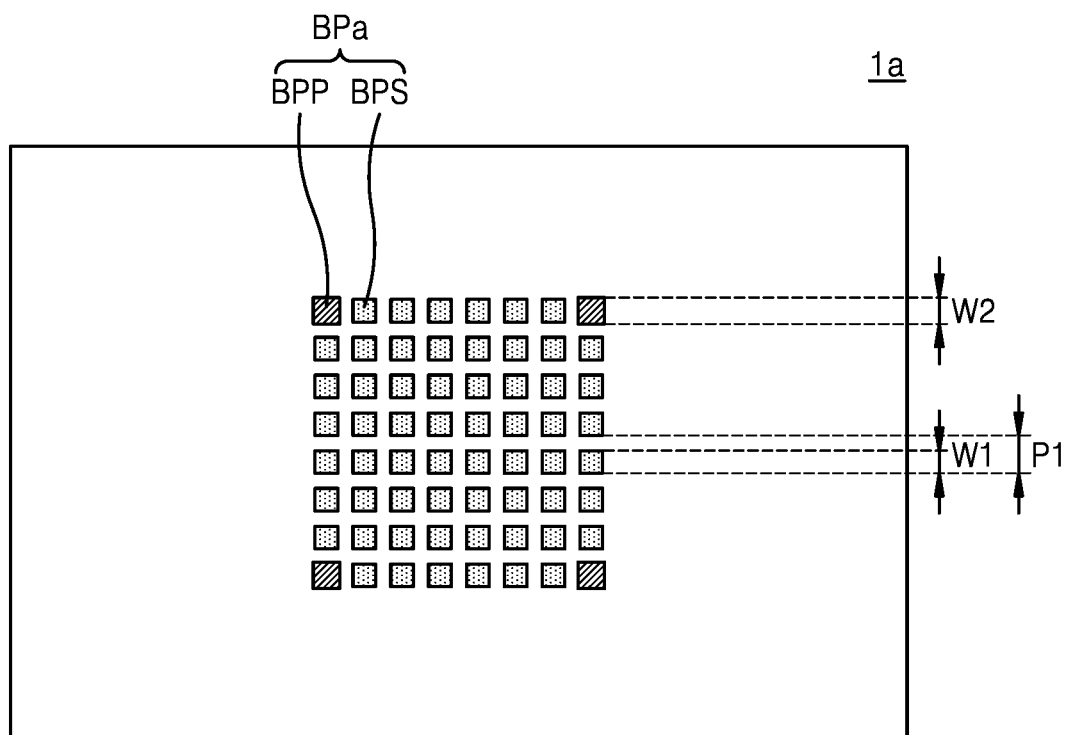

FIGS. 10A and 10B are plan views of a plurality of bonded pads in a semiconductor package 1, according to embodiments.

Referring to FIG. 10A, the semiconductor package 1 may include a plurality of bonded pads BP. The semiconductor package 1 may include any one of semiconductor packages 1000, 2000, 3000, 4000, and 5000 described with reference to FIGS. 1 through 9. The bonded pads BP may be the first bonded pads BP1, the first even bonded pads BP1$a$, the first odd bonded pads BP1$b$, or the second bonded pads BP2.

Each of the bonded pads BP may have the same first horizontal width W1. The first horizontal width W1 may range from about 0.5 µm to about 8 µm. The bonded pads BP may be arranged at the same first pitch P1. In some embodiment, the bonded pads BP may be arranged in a matrix array forming rows and columns.

Referring to FIG. 10B, a semiconductor package 1$a$ may include a plurality of bonded pads BPa. The semiconductor package 1$a$ may include any one of semiconductor packages 1000, 2000, 3000, 4000, and 5000 described with reference to FIGS. 1 through 9. The bonded pads BPa may be the first bonded pads BP1, the first even bonded pads BP1$a$, the first odd bonded pads BP1$b$, or the second bonded pads BP2.

The bonded pads BPa may include a plurality of signal bonded pads BPS and a plurality of power/ground bonded pads BPP. Each of the signal bonded pads BPS may have the same first horizontal width W1. The first horizontal width W1 may range from about 0.5 µm to about 8 µm. The signal bonded pads BPS may be arranged at the same first pitch P1. Each of the power/ground bonded pads BPP may have a second horizontal width W2 greater than the first horizontal width W1. The second horizontal width W2 may be greater than the first horizontal width W1 by about 5% to about 50%.

While the inventive concept has been particularly shown and described with reference to embodiments thereof, it will be understood that various changes in form and details may be made therein without departing from the spirit and scope of the following claims.

What is claimed is:

1. A semiconductor package comprising a first semiconductor chip, a second semiconductor chip, and at least one first bonded pad connecting the first and second semiconductor chips, wherein the first semiconductor chip comprises:
a first semiconductor substrate comprising a first active surface and a first inactive surface opposite to each other;
a plurality of first front surface pads disposed on the first active surface of the first semiconductor substrate;
at least one first penetrating electrode penetrating at least a portion of the first semiconductor substrate and connected to the first front surface pads;

a first rear surface cover layer disposed on the first inactive surface of the first semiconductor substrate; and
a first rear surface alignment pattern disposed in the first rear surface cover layer,
wherein the second semiconductor chip comprises:
a second semiconductor substrate stacked on the first semiconductor chip and comprising a second semiconductor element on a second active surface thereof;
a second front surface cover layer disposed on the second active surface of the second semiconductor substrate; and
a second front surface alignment pattern disposed in the second front surface cover layer and separated apart from the first rear surface alignment pattern,
wherein the first bonded pad penetrates the first rear surface cover layer and the second front surface cover layer, and is connected to the first penetrating electrode,
wherein the first bonded pad has a height that is greater than a sum of a thickness of the first rear surface cover layer and a thickness of the second front surface cover layer, and equal to or smaller than two times a sum of a thickness of the first rear surface alignment pattern and a thickness of the second front surface alignment pattern.

2. The semiconductor package of claim 1, wherein a lower surface of the first bonded pad is at a level lower than a lower surface of the first rear surface alignment pattern, and an upper surface of the first bonded pad is at a level higher than an upper surface of the second front surface alignment pattern.

3. The semiconductor package of claim 1, wherein the first penetrating electrode overlaps the first bonded pad in a vertical direction, and
wherein the first rear surface alignment pattern and the second front surface alignment pattern do not overlap the first penetrating electrode in the vertical direction.

4. The semiconductor package of claim 1, wherein the first rear surface alignment pattern is at a same level as a portion of the first bonded pad, and the second front surface alignment pattern is at a same level as another portion of the first bonded pad.

5. The semiconductor package of claim 1, wherein the first rear surface cover layer and the second front surface cover layer comprise the first rear surface alignment pattern and the second front surface alignment pattern, respectively, and are separated apart from each other.

6. The semiconductor package of claim 1, further comprising:
a first rear surface wiring structure disposed between the first semiconductor substrate and the first rear surface cover layer;
a first rear surface inter-wiring insulating layer surrounding the first rear surface wiring structure;
a second front surface wiring structure disposed between the second semiconductor substrate and the second front surface cover layer; and
a second front surface inter-wiring insulating layer surrounding the second front surface wiring structure,
wherein one end of the first bonded pad extends into the first rear surface inter-wiring insulating layer, and is connected to the first rear surface wiring structure through a first rear surface under bump metal (UBM) layer, and
wherein the other end of the first bonded pad extends into the second front surface inter-wiring insulating layer, and is connected to the second front surface wiring structure through a second front surface UBM layer therebetween.

7. The semiconductor package of claim 1, wherein the first bonded pad comprises a plurality first bonded pads arranged at a same pitch,
wherein each of the first bonded pads has a same horizontal width, and
wherein the first bonded pad has a horizontal width that is smaller than a horizontal width of each of the first rear surface alignment pattern and the second front surface alignment pattern.

8. A semiconductor package comprising a first semiconductor chip, a second semiconductor chip, and at least one first bonded pad connecting the first and second semiconductor chips,
wherein the first semiconductor chip comprises:
a first semiconductor substrate comprising a first semiconductor element on a first active surface thereof;
a plurality of first front surface pads disposed on the first active surface of the first semiconductor substrate;
at least one first penetrating electrode penetrating at least a portion of the first semiconductor substrate and connected to the first front surface pads;
a first rear surface cover layer disposed on a first inactive surface of the first semiconductor substrate; and
a first rear surface dummy conductive layer comprising a first rear surface alignment pattern and penetrating a portion of the first rear surface cover layer;
wherein the second semiconductor chip comprises:
a second semiconductor substrate stacked on the first semiconductor chip, and comprising a second semiconductor element on a second active surface thereof;
a second front surface cover layer disposed on the second active surface; and
a second front surface dummy conductive layer comprising a second front surface alignment pattern separated apart from the first rear surface alignment pattern and penetrating a portion of the second front surface cover layer; and
wherein the first bonded pad penetrates the first rear surface cover layer and the second front surface cover layer, and is connected to the first penetrating electrode.

9. The semiconductor package of claim 8, wherein the first rear surface dummy conductive layer and the second front surface dummy conductive layer respectively overlap a portion of the first bonded pad in a horizontal direction.

10. The semiconductor package of claim 8, wherein the first penetrating electrode overlaps the first bonded pad in a vertical direction.

11. The semiconductor package of claim 10, wherein the first rear surface dummy conductive layer and the second front surface dummy conductive layer do not overlap the first penetrating electrode in the vertical direction.

12. The semiconductor package of claim 8, further comprising:
a first rear surface wiring structure disposed between the first semiconductor substrate and the first rear surface cover layer;
a first rear surface inter-wiring insulating layer surrounding the first rear surface wiring structure;
a second front surface wiring structure disposed between the second semiconductor substrate and the second front surface cover layer; and a second front surface inter-wiring insulating layer surrounding the second front surface wiring structure,
wherein one end of the first bonded pad extends into the first rear surface inter-wiring insulating layer, and is connected to the first rear surface wiring structure, and
wherein the other end of the first bonded pad extends into the second front surface inter-wiring insulating layer, and is connected to the second front surface wiring structure.

13. The semiconductor package of claim 12, further comprising:
a first rear surface under bump metal (UBM) layer arranged between the one end of the first bonded pad and the first rear surface wiring structure; and
a second front surface UBM layer arranged between the other end of the first bonded pad and the second front surface wiring structure.

14. The semiconductor package of claim 12, wherein the first rear surface cover layer comprises a first lower rear surface cover layer disposed on the first rear surface wiring structure and the first rear surface inter-wiring insulating layer, and a first upper rear surface cover layer disposed on the first lower rear surface cover layer,
wherein the second front surface cover layer comprises a second lower front surface cover layer disposed on the second front surface wiring structure and the second front surface inter-wiring insulating layer, and a second upper front surface cover layer disposed on the lower front surface cover layer, and
wherein the first rear surface dummy conductive layer penetrates the first lower rear surface cover layer, and the second front surface dummy conductive layer penetrates the second lower front surface cover layer.

15. The semiconductor package of claim 14, wherein the first rear surface dummy conductive layer and the second front surface dummy conductive layer are separated from each other with the first upper rear surface cover layer and the second upper front surface cover layer therebetween.

16. The semiconductor package of claim 8, wherein the second semiconductor chip further comprises at least one second penetrating electrode that is configured to penetrate at least a portion of the second semiconductor substrate, and connected to the first bonded pad.

17. The semiconductor package of claim 16, wherein the first penetrating electrode, the first bonded pad, and the second penetrating electrode are aligned in a vertical direction.

18. A semiconductor package comprising:
a first semiconductor chip;
at least two second semiconductor chips stacked on the first semiconductor chip;
at least one first bonded pad connecting the second semiconductor chip at a lowermost end of the two second semiconductor chips to the first semiconductor chip; and
at least one second bonded pad connecting the two second semiconductor chips to each other,
wherein the first semiconductor chip comprises:
a first semiconductor substrate comprising a first active surface and a first inactive surface opposite to each other;
a plurality of first front surface pads arranged on the first active surface;
at least one first penetrating electrode penetrating at least a portion of the first semiconductor substrate, and connected to the first bonded pad;
a first rear surface cover layer comprising a first lower rear surface cover layer disposed on the first inactive surface and a first upper rear surface cover layer disposed on the first lower rear surface cover layer; and
a first rear surface dummy conductive layer disposed in the first lower rear surface cover layer and comprising a first rear surface alignment pattern,
wherein the two second semiconductor chips comprise:
a second semiconductor substrate comprising a second active surface and a second inactive surface opposite to each other;
a second front surface cover layer comprising a second lower front surface cover layer disposed on the second active surface, and a second upper front surface cover layer disposed on the second lower front surface cover layer;
a second front surface dummy conductive layer disposed in the second lower front surface cover layer and comprising a second front surface alignment pattern;
at least one second penetrating electrode penetrating at least a portion of the second semiconductor substrate, and connecting the first bonded pad to the second bonded pad;
a second rear surface cover layer comprising a second lower rear surface cover layer disposed on the second inactive surface, and a second upper rear surface cover layer disposed on the second lower rear surface cover layer; and
a second rear surface dummy conductive layer disposed in the second rear surface cover layer and comprising a second rear surface alignment pattern,
wherein the first bonded pad penetrates the first rear surface cover layer and a second front surface cover layer of the second semiconductor chip at the lowermost end, and
wherein the second bonded pad penetrates the second front surface cover layer and a second rear surface cover layer, facing each other, of another second semiconductor chip of the two second semiconductor chips.

19. The semiconductor package of claim 18, wherein each of the first bonded pad and the second bonded pad has a horizontal width ranging from about 0.5 µm to about 8 µm and a height ranging from about 0.8 µm to about 4.2 µm, and
wherein each of the first rear surface alignment pattern, the second front surface alignment pattern, and the second rear surface alignment pattern has a horizontal width ranging from about 20 µm to about 50 µm.

20. The semiconductor package of claim 18, wherein the first penetrating electrode, the first bonded pad, the second penetrating electrode, and the second bonded pad are aligned in a vertical direction.

* * * * *